US011405535B2

(12) United States Patent
Galor Gluskin

(10) Patent No.: US 11,405,535 B2
(45) Date of Patent: Aug. 2, 2022

(54) QUAD COLOR FILTER ARRAY CAMERA SENSOR CONFIGURATIONS

(71) Applicant: QUALCOMM Incorporated, San Diego, CA (US)

(72) Inventor: Micha Galor Gluskin, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 246 days.

(21) Appl. No.: 16/715,570

(22) Filed: Dec. 16, 2019

(65) Prior Publication Data

US 2020/0280659 A1 Sep. 3, 2020

Related U.S. Application Data

(60) Provisional application No. 62/812,234, filed on Feb. 28, 2019.

(51) Int. Cl.
H04N 5/225 (2006.01)
H01L 27/146 (2006.01)
(Continued)

(52) U.S. Cl.
CPC ..... H04N 5/2254 (2013.01); H01L 27/14627 (2013.01); H01L 27/14643 (2013.01);
(Continued)

(58) Field of Classification Search
CPC ............... H04N 5/2254; H04N 5/3696; H04N 9/04553; H04N 5/3535; H04N 5/36961;
(Continued)

(56) References Cited

U.S. PATENT DOCUMENTS 8,786,625 B2 7/2014 Côté et al.
10,070,042 B2 9/2018 Nikkanen et al.
(Continued)

FOREIGN PATENT DOCUMENTS

JP 5747238 B2 7/2015
JP 2016139988 A 8/2016
(Continued)

Primary Examiner — Thanh Luu
Assistant Examiner — Monica T Taba
(74) Attorney, Agent, or Firm — Polsinelli LLP

(57) ABSTRACT

Examples of capturing and processing image data are described. A device may include a camera including a camera sensor that includes a plurality of tiles that each include four sub-tiles. The camera may also include a color filter array coupled to the camera sensor and including a plurality of red, blue, and green color filters. A first sub-tile of each tile may include a phase detection pixel coupled to a microlens shared with at least one other pixel of the tile and an imaging pixel not coupled to a second microlens different from the first microlens. The device may also include a processor coupled to the camera and configured to control one or more first exposure settings of the phase detection pixel and control one or more second exposure settings of the non-phase detection pixel. Control of the second exposure settings is independent from control of the first exposure settings.

12 Claims, 18 Drawing Sheets

(51) Int. Cl.
*H04N 5/369* (2011.01)
*H04N 9/04* (2006.01)

(52) U.S. Cl.
CPC ....... *H04N 5/3696* (2013.01); *H04N 9/04553* (2018.08); *H01L 27/14605* (2013.01)

(58) Field of Classification Search
CPC ......... H01L 27/14643; H01L 27/14627; H01L 27/14605; H01L 27/14645; H01L 27/14623
See application file for complete search history.

(56) References Cited

U.S. PATENT DOCUMENTS

| | | |
|---|---|---|
| 2009/0027358 A1 | 1/2009 | Hosono |
| 2012/0062817 A1 | 3/2012 | Kanbayashi et al. |
| 2014/0192250 A1* | 7/2014 | Mitsunaga ............. H04N 5/374 348/349 |
| 2015/0350583 A1* | 12/2015 | Mauritzson ............ H04N 5/374 250/208.1 |
| 2016/0037089 A1 | 2/2016 | Silny et al. |
| 2017/0094210 A1 | 3/2017 | Galor et al. |
| 2017/0099422 A1 | 4/2017 | Goma et al. |
| 2017/0170222 A1* | 6/2017 | Toda ...................... H04N 5/378 |
| 2017/0366769 A1 | 12/2017 | Mlinar et al. |
| 2017/0366770 A1* | 12/2017 | Yokogawa ........ H01L 27/14623 |
| 2018/0007338 A1 | 1/2018 | Hirota |
| 2018/0130838 A1 | 5/2018 | Tian et al. |
| 2019/0067346 A1 | 2/2019 | Borthakur |
| 2021/0006756 A1* | 1/2021 | Sato ................... H04N 9/04553 |

FOREIGN PATENT DOCUMENTS

| | | |
|---|---|---|
| JP | 2018124471 A | 8/2018 |
| JP | 2019041178 A | 3/2019 |
| WO | WO-2017058488 A1 | 4/2017 |
| WO | WO-2018075706 A1 | 4/2018 |
| WO | WO-2019070299 A1 | 4/2019 |

\* cited by examiner

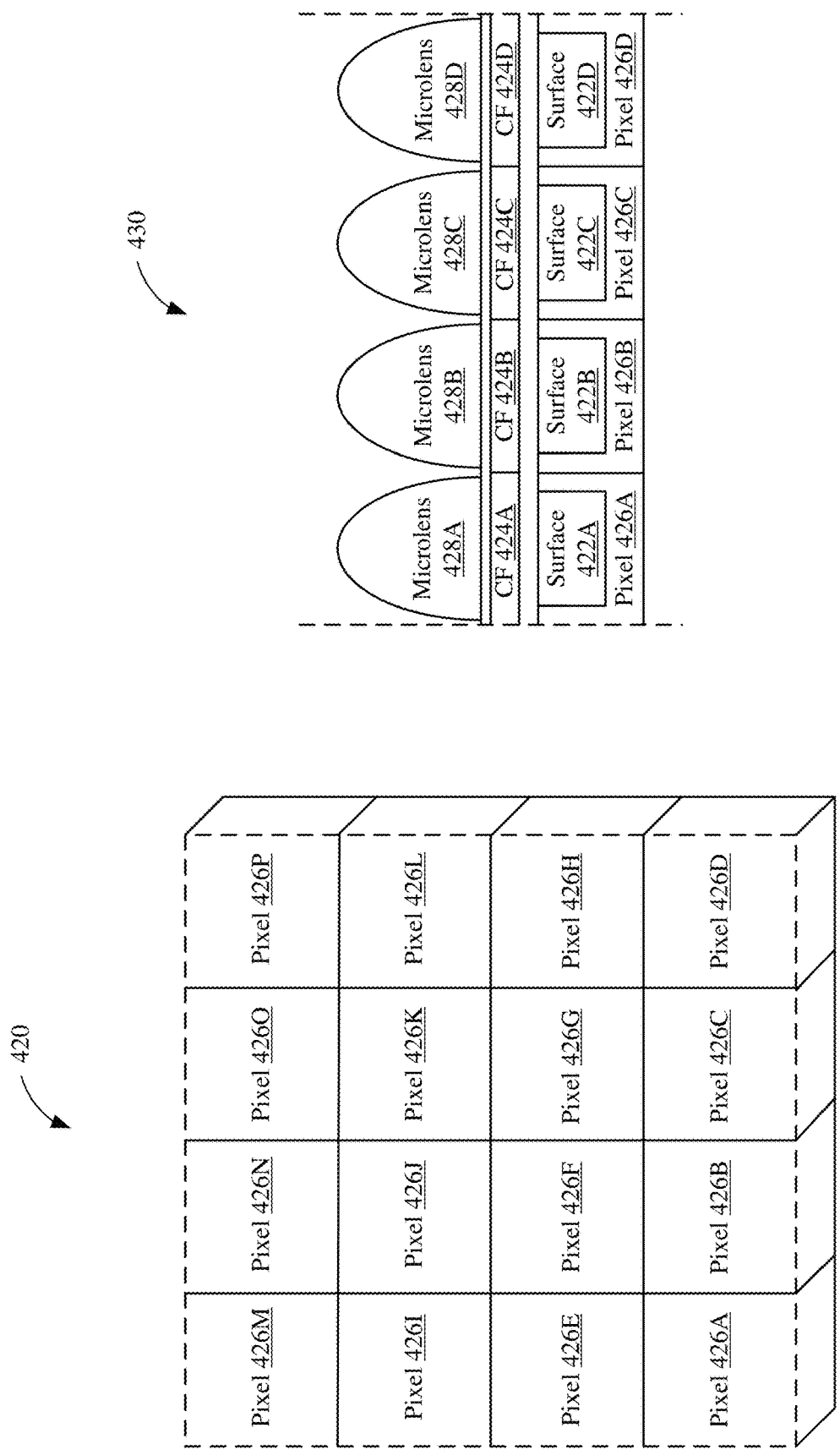

Controlling one or more first exposure settings of a first PD pixel of a first sub-tile of a camera sensor.
1402

Controlling one or more second exposure settings, independent from controlling one or more first exposure settings, of a first imaging pixel of the first sub-tile.
1404

Receiving captured image data from the camera.
1406

FIG. 14

QUAD COLOR FILTER ARRAY CAMERA SENSOR CONFIGURATIONS

RELATED APPLICATION

This application claims priority to U.S. Provisional Patent Application No. 62/812,234, titled "QUAD COLOR FILTER ARRAY CAMERA SENSOR CONFIGURATIONS," filed Feb. 28, 2019, which is hereby incorporated by reference in its entirety.

TECHNICAL FIELD

This disclosure relates generally to systems and methods for image capture devices, and specifically to modified Quad color filter array camera sensor configurations.

BACKGROUND OF RELATED ART

Devices including or coupled to one or more digital cameras use a camera lens to focus incoming light onto a camera sensor for capturing digital images. The curvature of a camera lens places a range of depth of the scene in focus. Portions of the scene closer or further than the range of depth may be out of focus, and therefore appear blurry in a captured image. The distance of the camera lens from the camera sensor (the "focal length") is directly related to the distance of the range of depth for the scene from the camera sensor that is in focus (the "focus distance"). Many devices are capable of adjusting the focal length, such as by moving the camera lens to adjust the distance between the camera lens and the camera sensor, and thereby adjusting the focus distance.

Many devices automatically determine the focal length. For example, a user may touch an area of a preview image provided by the device (such as a person or landmark in the previewed scene) to indicate the portion of the scene to be in focus. In response, the device may automatically perform an autofocus (AF) operation to adjust the focal length so that the portion of the scene is in focus. The device may then use the determined focal length for subsequent image captures (including generating a preview).

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

Examples of capturing and processing image data are described. An example device may include a camera including a camera sensor that may include a plurality of tiles that may each include four sub-tiles of pixels. The camera may also include a color filter array (CFA) coupled to the camera sensor and including a plurality of red, blue, and green color filters. A first sub-tile of each tile may include a phase detection pixel coupled to a microlens shared with at least one other pixel of the tile and an imaging pixel coupled to a second microlens different from the first microlens. The device may also include a processor coupled to the camera and configured to control one or more first exposure settings of the phase detection pixel and control one or more second exposure settings of the non-phase detection pixel. Control of the second exposure settings is independent from control of the first exposure settings.

In some other implementations, an example method may include controlling, by a processor, one or more first exposure settings of a first PD pixel of a camera sensor of a camera. The method may also include controlling, by the processor, one or more second exposure settings of a first imaging pixel of the camera sensor. The one or more second exposure settings are controlled independently from the one or more first exposure settings. The method may further include receiving, by the processor, captured image data from the camera coupled to the processor. The captured image data from the camera is based on at least one of the one or more first exposure settings or the one or more second exposure settings. The camera includes the camera sensor including a plurality of tiles of four pixels by four pixels. Each tile includes a first sub-tile, a second sub-tile, a third sub-tile, and a fourth sub-tile of two pixels by two pixels. The camera also includes a CFA coupled to the camera sensor, the CFA including a plurality of red color filters, a plurality of green color filters, and a plurality of blue color filters. Each first sub-tile includes the first PD pixel coupled to a first microlens shared with at least one other pixel of the tile and the first imaging pixel coupled to a second microlens different from the first microlens.

In some further implementations, an example computer readable medium is described. The computer readable medium may store instructions that, when executed by a processor of a device, cause the device to control one or more first exposure settings of a first PD pixel of a camera sensor of a camera, and control one or more second exposure settings of a first imaging pixel of the camera sensor. The one or more second exposure settings are controlled independently from the one or more first exposure settings. Execution of the instructions may also cause a processor of the device to receive captured image data from the camera coupled to the processor. The captured image data from the camera may be based on at least the one or more first exposure settings or the one or more second exposure settings. The camera includes the camera sensor including a plurality of tiles of four pixels by four pixels. Each tile includes a first sub-tile, a second sub-tile, a third sub-tile, and a fourth sub-tile of two pixels by two pixels. The camera also includes a CFA coupled to the camera sensor, the CFA including a plurality of red color filters, a plurality of green color filters, and a plurality of blue color filters. Each first sub-tile includes the first PD pixel coupled to a first microlens shared with at least one other pixel of the tile and the first imaging pixel coupled to a second microlens different from the first microlens.

In some other implementations, a device may include means for controlling one or more first exposure settings of a first PD pixel of a camera sensor of a camera, and means for controlling one or more second exposure settings of a first imaging pixel of the camera sensor. The one or more second exposure settings are controlled independently from the one or more first exposure settings. The device may also include means for receiving captured image data from the camera. The captured image data from the camera may be based on the one or more first exposure settings or the one or more second exposure settings. The camera includes the camera sensor including a plurality of tiles of four pixels by four pixels. Each tile includes a first sub-tile, a second sub-tile, a third sub-tile, and a fourth sub-tile of two pixels by two pixels. The camera also includes a CFA coupled to the camera sensor, the CFA including a plurality of red color filters, a plurality of green color filters, and a plurality of blue color filters. Each first sub-tile includes the first PD pixel coupled to a first microlens shared with at least one other pixel of the tile and the first imaging pixel coupled to a second microlens different from the first microlens.

BRIEF DESCRIPTION OF THE DRAWINGS

Aspects of the present disclosure are illustrated by way of example, and not by way of limitation, in the figures of the accompanying drawings and in which like reference numerals refer to similar elements.

FIG. 4B is a depiction of a portion of an example camera sensor.

FIG. 11 is a depiction of example tiles of a camera sensor.

FIG. 14 is an illustrative flow chart depicting an example operation for controlling the exposure settings of different pixels of a sub-tile of a modified QCFA camera sensor.

DETAILED DESCRIPTION

Figure 1:
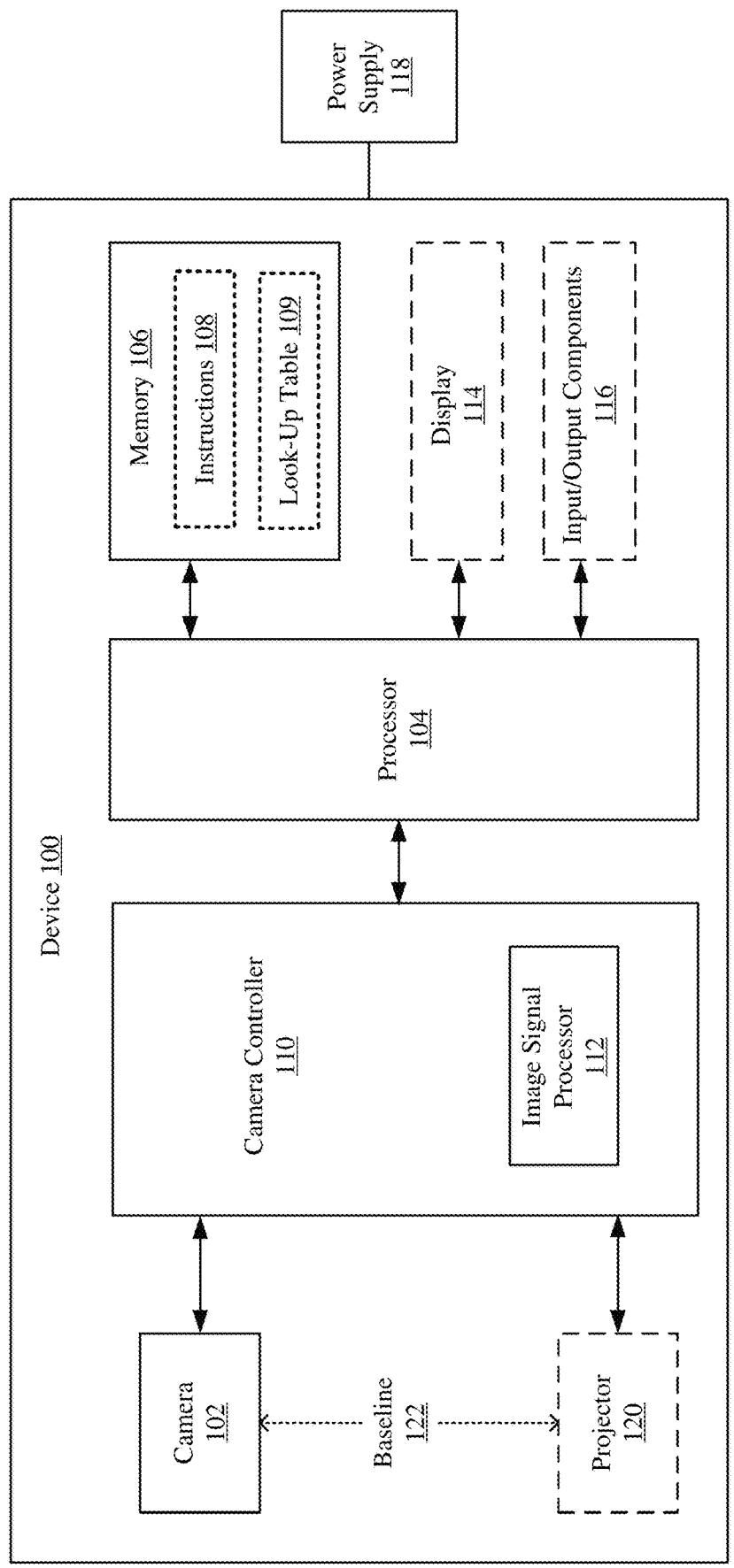
FIG. 1 is a block diagram of an example device including one or more camera sensors.

Aspects of the present disclosure relate to quad color filter array (QCFA) camera sensors for phase detection operations (such as for phase detection autofocus (PDAF) or other depth sensing operations) as well as for imaging operations. A camera performing a PDAF operation traditionally included a sensor array for detecting phases separate from the camera sensor for imaging. Light entering the camera would be diffracted to both the sensor array for detecting phases and the camera sensor for imaging.

Instead of having a separate sensor array, a camera may include phase detection (PD) pixels distributed among the array of pixels of the camera sensor. For example, the camera may include a sparse PD camera sensor where approximately three percent of the pixels are PD pixels. PD pixels are pixels that are logically grouped into at least a first set of pixels for capturing image data from a first perspective and a second set of pixels for capturing image data from a second perspective. The captured image data may be processed to detect phases for the two perspectives and compared to determine phase differences. Since only a small portion of the pixels of the camera sensor are used for PD (which may be referred to as sparse PD), some portions of the scene may not be included in the captured image data from the PD pixels and therefore may not be associated with the phase detections. For example, a focus setting may not be determined for placing an object in the scene in focus for the camera. In another example, holes in a depth map may exist or be larger as a result of the sparseness of the PD pixels.

In another example and in contrast to sparse PD, a camera sensor may be a dual pixel camera sensor. Each pixel of a dual pixel camera sensor includes two photodiodes. One photodiode of each pixel is configured for PD, and therefore every pixel is a PD pixel. For example, each pixel may include two photosensitive surfaces (with each surface coupled to one of the photodiodes). A first photosensitive surface may be configured for imaging (such as the surface coupled to a color filter of a color filter array for capturing color image data). The second photosensitive surface may be coupled to the other photodiode and configured to capture image data from a defined perspective. The captured image data from the perspective is used to detect phases and determine phase differences. The second photosensitive surface may be coupled to a clear color filter, a green color filter, IR filter, etc., different than the color filter coupled to the first photosensitive surface. In this manner, a larger number of phase differences may be determined than by using sparse PD (which may be referred to as dense PD). However, the photosensitive surface of each pixel is split instead of being configured as a whole for capturing image data for imaging. Reducing the size of the photosensitive surface may negatively affect imaging. Additionally, producing dual pixel sensors increases in cost and complexity as pixels decrease in size.

Some devices including a camera sensor for determining depths may also include a light emitter and be configured to perform active depth sensing. For active depth sensing, reflections of a transmission (such as a light transmission) are sensed and used in determining one or more depths. One example active depth sensing system is a structured light depth sensing system. For a structured light depth sensing system, a device may include a light projector to project a distribution of light and a camera sensor separated from the light projector by a baseline distance to sense reflections of the distribution of light. Portions of the distribution are identified in the sensed reflections, and distances of objects in a scene are determined based on the identified portions and the baseline distance between the projector and the camera sensor. If structured light depth sensing is performed in the infrared light spectrum, the device may include a light projector that projects a distribution of infrared (IR) light (such as a distribution of IR light points) onto a scene. The photodiodes of the camera sensor capture reflections of the IR light in capturing image data, and the device determines depths or distances of objects in the scene based on identified portions of the distribution in the captured reflections.

Another example depth sensing system is a time of flight (ToF) system. For a ToF system, the projector may project pulses, and the camera sensor may sense the pulses. The round trip times of the pulses are determined, and depths are determined based on the round trip times and the speed of the pulses. In another example, the projector may project amplitude modulated continuous waves (AMCWs), such as amplitude modulated IR light. The camera sensor senses reflections of the AMCWs, and the device determines depths or distances of objects in the scene from the sensed reflections of AMCWs. In a further example of active depth sensing, the device may include a light projector to emit a diffuse light (such as a diffuse IR light). The camera sensor senses reflections of the diffuse IR light in capturing image data, and the device determines depths or distances of objects in the scene based on the intensities of the reflections sensed by the camera sensor.

In some implementations of active depth sensing systems using IR light, the PD pixels of the camera sensor may be configured to sense IR light (such as by being coupled to a clear color filter, being coupled to an IR filter, or including an IR photodiode). As noted above, a sparse PD camera sensor may include gaps in PD pixels for which depths of objects in the scene associated with the gap are not determined. A dual pixel camera sensor may reduce the size and number of holes in the scene for which depths of objects are not determined, but imaging operations may be negatively impacted by the reduced size in photosensitive surfaces configured for imaging applications. Additionally, as noted above, dual pixel camera sensors may be more expensive to manufacture and implement in a device than camera sensors with fewer PD pixels. For example, a camera sensor configured for sparse PD is less expensive to produce than a dual pixel camera sensor, and the camera sensor includes less photodiodes to be controlled by a device than a dual pixel camera sensor. Further, as pixels decrease in size, the cost and difficulty in manufacturing a dual pixel camera sensor increases.

In some implementations, a camera sensor may be configured to perform PD with greater resolution than sparse PD and without requiring multiple photodiodes per pixel (such as for a dual pixel sensor). For example, the camera sensor may be a quad CFA (QCFA) camera sensor (such as a quad Bayer camera sensor) configured to include at least one pair of PD pixels (PD pair) per tile of pixels associated with a repeating patch of color filters of the CFA. For a quad Bayer camera sensor, the camera sensor may include at least one PD pair for each four pixel by four pixel (4×4) tile including a red sub-tile, blue sub-tile, and two green sub-tiles (based on the color of the color filters coupled to the pixels of the sub-tiles).

The density of the PD pixel distribution may also allow the device to perform monochrome imaging for low-light environments while not interfering with the QCFA camera sensor being used for remosaicing to lower resolution imaging for low-light environments. For example, the quad Bayer camera sensor may still be used for capturing image data in a Bayer pattern at one fourth the resolution of the quad Bayer camera sensor.

In the following description, numerous specific details are set forth, such as examples of specific components, circuits, and processes to provide a thorough understanding of the present disclosure. The term "coupled" as used herein means connected directly to or connected through one or more intervening components or circuits. Also, in the following description and for purposes of explanation, specific nomenclature is set forth to provide a thorough understanding of the present disclosure. However, it will be apparent to one skilled in the art that these specific details may not be required to practice the teachings disclosed herein. In other instances, well-known circuits and devices are shown in block diagram form to avoid obscuring teachings of the present disclosure. Some portions of the detailed descriptions which follow are presented in terms of procedures, logic blocks, processing and other symbolic representations of operations on data bits within a computer memory. In the present disclosure, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing the terms such as "accessing," "receiving," "sending," "using," "selecting," "determining," "normalizing," "multiplying," "averaging," "monitoring," "comparing," "applying," "updating," "measuring," "deriving," "settling" or the like, refer to the actions and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

In the figures, a single block may be described as performing a function or functions; however, in actual practice, the function or functions performed by that block may be performed in a single component or across multiple components, and/or may be performed using hardware, using software, or using a combination of hardware and software. To clearly illustrate this interchangeability of hardware and software, various illustrative components, blocks, modules, circuits, and steps are described below generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure. Also, the example devices may include components other than those shown, including well-known components such as a processor, memory and the like.

Aspects of the present disclosure are applicable to any suitable electronic device configured to capture images or video (such as a security system with one or more cameras, smartphones, tablets, laptop computers, digital video and/or still cameras, web cameras, etc.). While described below with respect to a device having or coupled to one camera, aspects of the present disclosure are applicable to devices having any number of cameras, and are therefore not limited to devices having one camera.

The term "device" is not limited to one or a specific number of physical objects (such as one smartphone, one camera controller, one processing system and so on). As used herein, a device may be any electronic device with one or more parts that may implement at least some portions of this disclosure. While the below description and examples use the term "device" to describe various aspects of this disclosure, the term "device" is not limited to a specific configuration, type, or number of objects.

FIG. 1 is a block diagram of an example device 100 including or coupled to one or more cameras 102. The example device 100 may also include one or more processors 104, a memory 106 storing instructions 108, and a camera controller 110. The device 100 may optionally include or be coupled to a display 114, one or more input/output (I/O) components 116, and one or more projectors 120. The device 100 may also include or be coupled to a power supply 118. The device 100 may include additional features or components not shown. For example, a wireless interface, which may include a number of transceivers and a baseband processor, may be included for a wireless communication device (e.g., a smartphone or a tablet). The example device 100 is for illustrative purposes in describing aspects of the disclosure, and the disclosure should not be limited to any specific examples or illustrations, including the example device 100. As used herein, referring to a component in the singular (e.g., camera 102, image signal processor 112, processor 104, etc.) may refer to one instance of the component or multiple instances of the component (such as multiple cameras 102, multiple image signal processors 112, multiple processors 104, etc.).

A camera 102 may be configured to capture image data for individual image frames, which may be used to generate still images or video. The camera 102 may include a camera sensor and camera lens, or may be a dual camera module or any other suitable module with multiple camera sensors and lenses. A camera sensor of the camera 102 may be of any suitable configuration for dense PD that is sparser than a dual pixel camera sensor. The camera sensor may also be configured to capture image data for active depth sensing. For example, the camera sensor may sense reflections of light distributions projected by a projector 120.

The projector 120 may include one or more flash sources or flood illuminators (such as light-emitting diodes (LEDs)). In some example implementations, the projector 120 may include a structured light projector for active depth sensing. For example, the projector 120 may be configured to project a predefined distribution of infrared (IR) light points. In some other example implementations, the projector 120 may include an IR projector to project a diffuse IR light onto a scene.

IR light may include portions of the visible light spectrum and/or portions of the light spectrum that is not visible to the naked eye. In one example, IR light may include near infrared (NIR) light, which may or may not include light within the visible light spectrum, and/or IR light (such as far infrared (FIR) light) which is outside the visible light spectrum. The term IR light should not be limited to light having a specific wavelength in or near the wavelength range of IR light. Further, IR light is provided as an example emission from the projector. In the following description, other suitable wavelengths of light may be used.

In some implementations of active depth sensing, the projector 120 may be separated from the camera 102 by a baseline 122. The projector 120 may be configured to project a distribution of light, and the photodiodes of the camera sensor may capture image data including reflections of the distribution. The device 100 (such as the image signal processor 112 or the processor 104) may measure the intensities and location on the camera sensor of the sensed reflections from the captured image data.

In some other implementations of active depth sensing, the projector 120 may be configured to project a diffuse IR light. The device 100 may measure intensities of the sensed reflections from the captured image data. If a diffuse IR light is projected, the device 100 may not include the baseline 122 between the projector 120 and the camera 102, or the baseline 122 may not be used for depth sensing. For example, the projector 120 may be collocated with or located in close proximity to the camera 102.

The memory 106 may be a non-transient or non-transitory computer readable medium storing computer-executable instructions 108 to perform all or a portion of one or more operations described in this disclosure. The memory 106 may also store a look-up table (LUT) 109 or other directory to be used for active depth sensing. For example, if the projector 120 is configured to project a known distribution of light points for structured light depth sensing, the distribution may be logically divided into a plurality of codewords including a subset of light points. The LUT 109 may include a library of the codewords of the distribution. The LUT 109 may also include information regarding the location of codewords with respect to one another in the distribution. In this manner, the device 100 may use the LUT 109 to identify codewords in the sensed reflections.

The processor 104 may be one or more suitable processors capable of executing scripts or instructions of one or more software programs (such as instructions 108) stored within the memory 106. In some aspects, the processor 104 may be one or more general purpose processors that execute instructions 108 to cause the device 100 to perform any number of functions or operations. In additional or alternative aspects, the processor 104 may include integrated circuits or other hardware to perform functions or operations without the use of software. While shown to be coupled to each other via the processor 104 in the example of FIG. 1, the processor 104, the memory 106, the camera controller 110, the optional display 114, and the optional I/O components 116 may be coupled to one another in various arrangements. For example, the processor 104, the memory 106, the camera controller 110, the optional display 114, and/or the optional I/O components 116 may be coupled to each other via one or more local buses (not shown for simplicity).

The display 114 may be any suitable display or screen allowing for user interaction and/or to present items for viewing by a user (such as preview images, generated final images, a depth map, etc.). In some aspects, the display 114 may be a touch-sensitive display. The I/O components 116 may be or include any suitable mechanism, interface, or device to receive input (such as commands) from the user and to provide output to the user. For example, the I/O components 116 may include (but are not limited to) a graphical user interface, keyboard, mouse, microphone and speakers, and so on. The display 114 and/or the I/O components 116 may provide a preview image to a user and/or receive a user input for adjusting one or more settings of the camera 102 (such as selecting and/or deselecting a region of interest of a displayed preview image for an AF operation).

The camera controller 110 may include image signal processor 112, which may be one or more image signal processors to process captured image data provided by the camera 102. In some example implementations, the camera controller 110 (such as the image signal processor 112) may also control operation of the camera 102 and the projector 120. In some aspects, the image signal processor 112 may execute instructions from a memory (such as instructions 108 from the memory 106 or instructions stored in a separate memory coupled to the image signal processor 112) to process captured image data from the one or more cameras 102. In other aspects, the image signal processor 112 may include specific hardware to process the captured image data. The image signal processor 112 may alternatively or additionally include a combination of specific hardware and the ability to execute software instructions.

The device 100 may perform one or more PD operations. For example, the device 100 may perform phase detection autofocus (PDAF) for the camera 102. For PDAF, two instances of the light from an object passes through different portions of a camera lens. If the two instances of light align on the camera sensor, the object is in focus for the camera 102. If the two instances are received at different locations of the camera sensor, the object is out of focus for the camera 102.

Figure 2A:
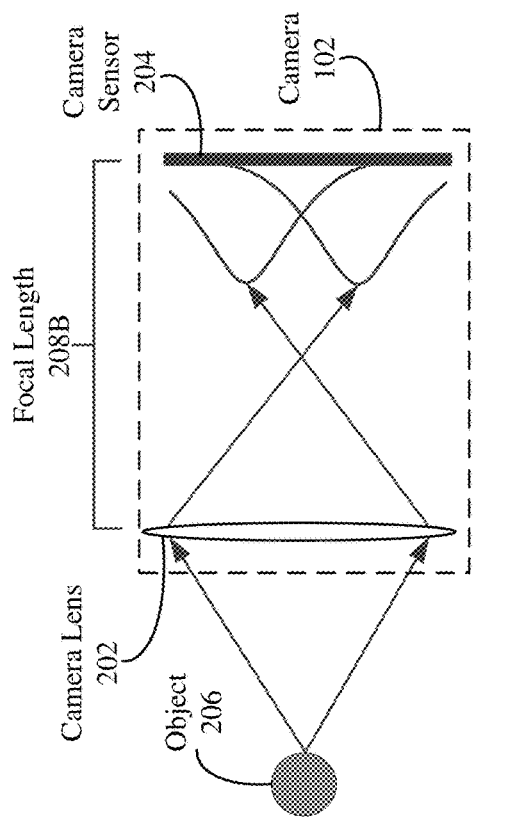
FIG. 2A is a depiction of a camera lens at a focal length so that an object is in focus.
Figure 2B:
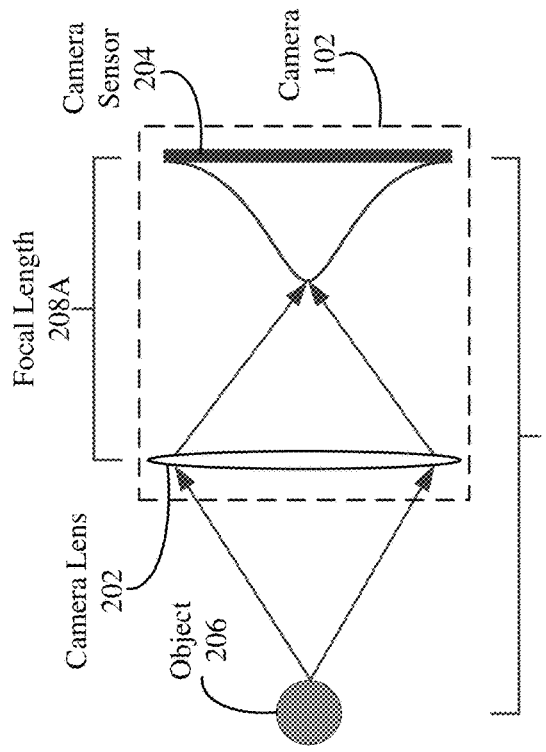
FIG. 2B is a depiction of a camera lens at too long of a focal length so that the object is out of focus.
Figure 2C:
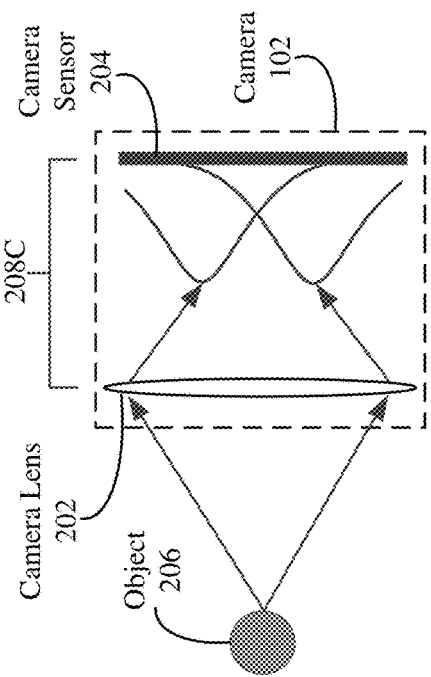
FIG. 2C is a depiction of a camera lens at too short of a focal length so that the object is out of focus.

FIG. 2A is a depiction of the camera 102 from the device 100 with a camera lens 202 at a focal length 208A (from the camera sensor 204) so that an object 206 is in focus at focus distance 210. FIG. 2B is a depiction of the camera 102 from the device 100 with the camera lens 202 at too long of a focal length 208B so that an object 206 is out of focus. FIG. 2C is a depiction of the camera 102 from the device 100 with the camera lens 202 at too short of a focal length 208C so that an object 206 is out of focus.

PDAF includes determining the phase difference between two instances of light from the same object hitting the camera sensor 204. For example, the phase difference may be a distance between the locations of the two instances hitting the camera sensor 204 (such as a number of pixels of the camera sensor between the instances of light). In FIG. 2A, the phase difference is zero because the two instances (depicted by the arrows from object 206) align on the camera sensor 204. In FIGS. 2B and 2C, the phase difference is greater than and less than zero, respectively, since the two instances do not align on the camera sensor 204. The phase difference value may be the number of pixels or another distance between the two peaks on the camera sensor 204 (with the curves indicating the intensity values of light from the object 206 measured at each pixel).

Figure 3:
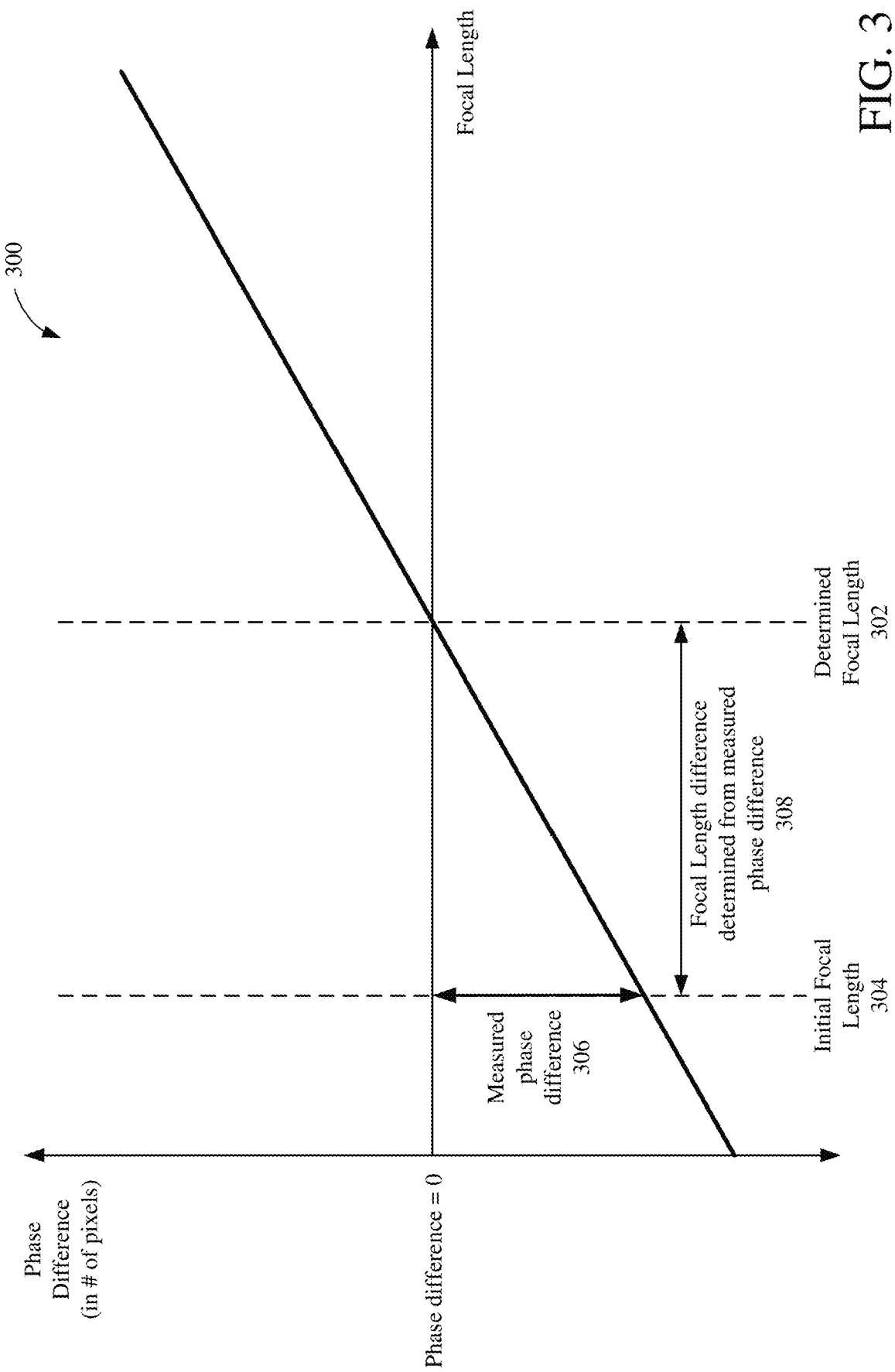
FIG. 3 is a depiction of an example correlation between focal length and phase difference for phase difference autofocus.

FIG. 3 is a depiction 300 of an example correlation between focal length and phase difference for PDAF. As illustrated, the correlation is linear. If the phase difference 306 is measured for an initial focal length 304, the device 100 preforming PDAF may include determining the focal length difference 308 (based on the slope and offset of the phase difference line). If the camera lens 202 is moveable, the camera 102 may include an actuator (not shown) to move the camera lens 202 toward or away from the camera sensor 204. In this manner, the device may adjust the focal length (and therefore the focus distance) by moving the camera lens 202 a position corresponding to the determined focal length 302 (where the phase difference is zero).

FIGS. 2A-2C depict a traditional method of performing PDAF (which may be referred to as sensor level PDAF) to illustrate aspects of PDAF. In some implementations, the camera sensor of the camera 102 may include a plurality of PD pixels grouped into PD pairs that may be used in measuring one or more phase differences (which may be referred to as pixel level PD).

Figure 4A:
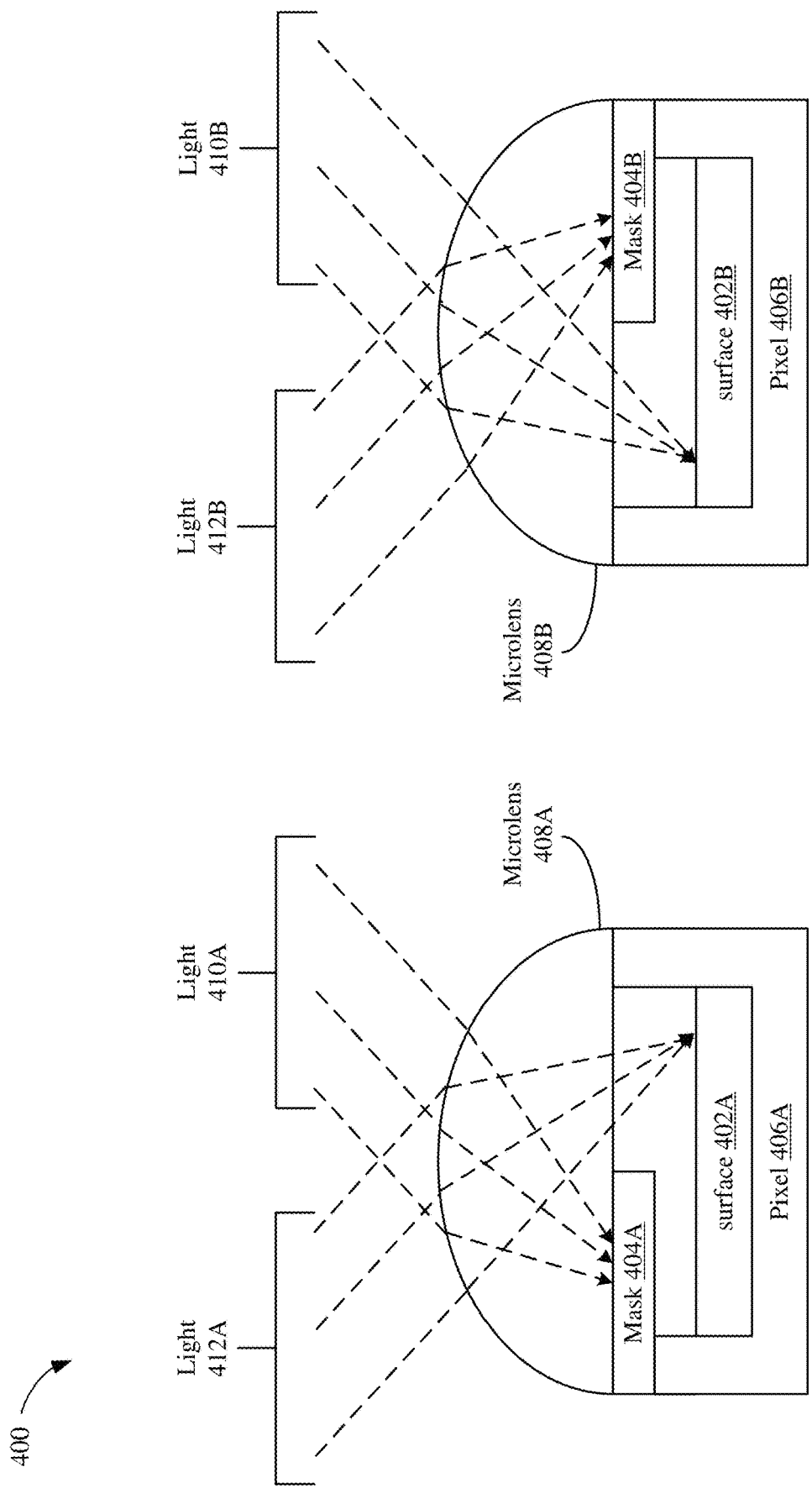
FIG. 4A is a depiction of an example phase detection pixel pair configured to capture image data from different perspectives in performing pixel level phase detection.

FIG. 4A is a depiction of an example PD pair 400 configured to capture image data from different perspectives through the use of masks. The PD pair 400 includes PD pixel 406A including a photosensitive surface 402A and PD pixel 406B including a photosensitive surface 402B. The PD pixel 406A is coupled to a microlens 408A to direct light to the surface 402A, and the PD pixel 406B is coupled to a microlens 408B to direct light to the surface 402B. As used herein, a pixel "coupled to" a microlens refers to the pixel with a photosensitive surface configured to receive light directed by the microlens to the pixel. The pixel 406A includes a mask 404A occluding a portion of the surface 402A, and the pixel 406B includes a mask 404B occluding a portion of the surface 402B. As shown, the mask 404A and the mask 404B occlude different portions of the surface 402A and the surface 402B to configure the pixels 406A and 406B to capture image data from different perspectives.

For example, light 410A from a first perspective may be directed by the microlens 408A toward the surface 402A of the pixel 406A, but the light 410A may be blocked by the mask 404A. Referring to the pixel 406B, light 410B from the first perspective may be directed by the microlens 408B to the surface 402B (which is not blocked by the mask 404B). Referring to the pixel 406A, light 412A from a second perspective may be directed by the microlens 408A to the surface 402A (which is not blocked by the mask 404A). In contrast, light 412B from the second perspective may be directed by the microlens 408B toward the surface 402B of the pixel 406B, but the light 412B may be blocked by the mask 404B In this manner, the pixel 406A may be configured to capture image data from the first perspective, and the pixel 406B may be configured to capture image data from the second perspective.

A first subset of pixels of the camera sensor may be PD pixels configured to capture image data from the first perspective (e.g., a left perspective), and a second subset of pixels of the camera sensor may be PD pixels configured to capture image data from the second perspective (e.g., a right perspective). In some implementations, the camera sensor may also include PD pairs configured to capture image data from perspectives 90 degrees with respect to the first perspective and the second perspective (e.g., top and bottom perspectives).

In addition to PD pairs, a camera sensor may be coupled to a color filter array (CFA) for color imaging. A pixel of the camera sensor may be coupled to a color filter of the CFA, and the color filter may filter frequencies outside the specific color spectrum (thus causing the pixel to capture image information for a specific color of a corresponding location in the scene). In some example implementations, a CFA is a mosaic of color filters where a color filter is disposed over, or otherwise coupled to, one or more pixels of the camera sensor. The filter may allow a range of wavelengths corresponding to a specific color to reach the corresponding pixel, and the pixel may measure the intensity of the received light corresponding to the specific color.

FIG. 4B is a depiction of a portion of an example camera sensor 420. The view of the example camera sensor 420 is from a camera aperture toward the camera sensor. The portion of the camera sensor 420 includes pixels 426A-426P. View 430 is a side view of pixels 426A-426D of the camera sensor 420. Each pixel 426A-426D includes a photosensitive surface 422A-422D, which may be coupled to a photodiode (not shown) for capturing image data. Each pixel 426A-426D is coupled to a color filter 424A-424D of a CFA. Each pixel 426A-426D further includes a corresponding microlens 428A-428D to direct light toward the corresponding surface 422A-422D. The colors of the color filter may be red, green, and blue. In some implementations, some pixels (such as PD pixels) may be coupled to a clear color filter (or no filter) or may be coupled to an IR filter. In some implementations, a pixel being coupled to an IR filter may refer to the photodiode of the pixel being an IR photodiode configured to sense light in the IR spectrum.

The CFA may include a pattern of color filters that repeats for each patch of the camera sensor. For example, a pattern of red, green, and blue color filters may repeat every n×n tile of pixels of the camera sensor. One example pattern is a Bayer pattern for a 2×2 tile of pixels.

Figure 5:
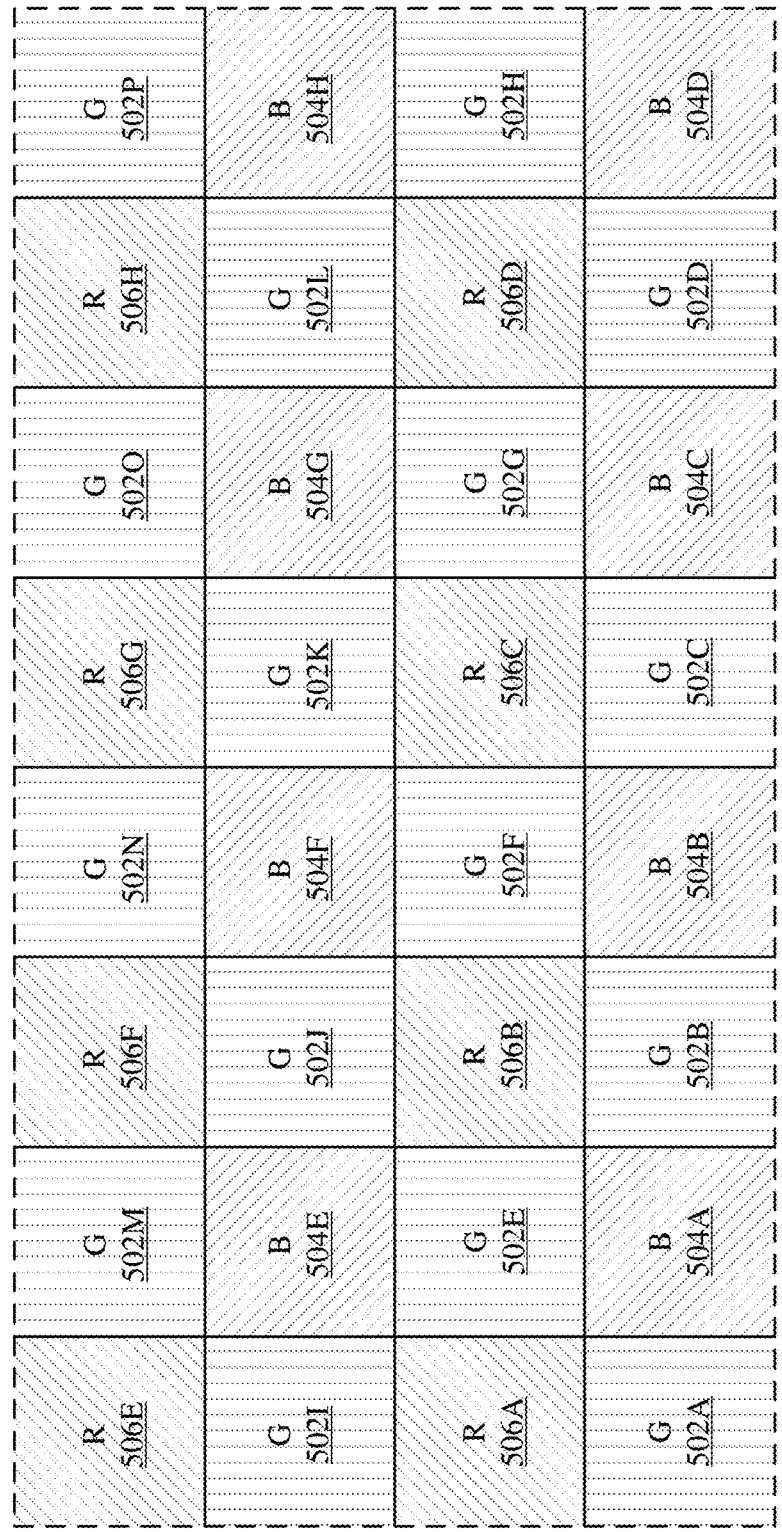
FIG. 5 is a depiction of a portion of a Bayer color filter array (CFA).

FIG. 5 is a depiction of a portion of a Bayer CFA 500. A Bayer pattern is an example pattern with a 2×2 pixel repeating pattern of colors for the CFA. A shown, the Bayer CFA 500 includes a green color filter for every other pixel of a camera sensor (e.g., G 502A-502P). Every other row includes a blue color filter between green color filters in the row (e.g., B 504A-504H), and the other rows include a red color filter between green color filters in the row (e.g., R 506A-506H). Descriptions and illustrations herein may refer to pixels coupled to red color filters as R, pixels coupled to blue color filters as B, and pixels coupled to green color filters as G. As used herein, a pixel "coupled to" a color filter refers to a pixel with a photosensitive surface configured to receive light directed through the color filter to the pixel.

The device 100 performing image processing using a camera sensor (such as a camera sensor coupled to a Bayer CFA) for a camera 102 may include resetting or clearing the pixel array, exposing the photosensitive surfaces of the pixels to light, measuring the sensed light's intensity at each surface by the pixel's photodiode, and reading the photodiode measurements from the pixel array. The time for these actions together may be referred to as an exposure window. At the beginning of the exposure window, the device 100 may clear the photocharge that may be stored at each pixel. The device 100 may then expose the pixels of the camera sensor to incident light for a predetermined amount of time (such as an exposure length), and the one or more photodiodes of a sensor pixel can convert the received light into a photocurrent which may be stored as a photocharge (e.g., current level) for the pixel. At the conclusion of the exposure window, the device 100 may read out the one or more photocharges in the sensor pixel and convert the photocharges into a digital photometric. The digital photometric may indicate a color value of an image pixel mapped to the camera sensor pixel. The type of color filter of the camera sensor pixel may be the color channel of the image pixel. Once the read out of photocharges from the camera sensor pixels are converted to photometrics, the device 100 may assemble an image mosaic with a color pattern matching the CFA of the camera sensor.

Exposure of camera sensor pixels may be global or rolling (i.e., a global shutter or a rolling shutter). For a global shutter, each sensor pixel may begin and/or conclude exposure at the same time (e.g., substantially at the same time). For a rolling shutter, different regions of the sensor panel 121 may begin and/or conclude exposure at different times. A rolling shutter may be configured, though, for pixels of a block of pixels to be exposed concurrently.

The device 100 may enable the user to select between high-dynamic range (HDR) and non-HDR imaging. If the user selects HDR imaging, the device 100 may capture image data for multiple frames using different exposure settings (such as different exposure lengths) for each frame. For example, the device 100 may adjust the shutter to alter the exposure time for the pixels.

For the example camera sensor 420 (FIG. 4B) to also perform a PD operation (such as PDAF), a subset of pixels may not be coupled to a color filter or may be coupled to a different color filter, a clear color filter, an IR filter, etc. For example, each PD pixel of the camera sensor may be coupled to a clear color filter to measure all incident light received. In another example, each PD pixel may include an IR photodiode configured to measure the intensity of IR light received at the pixel. An example camera sensor with photodiodes configured to measure IR light is an RGB-IR camera sensor, which in some examples may include a 2×2 repeating pattern of pixels or a 4×4 repeating pattern of pixels.

Figure 6:
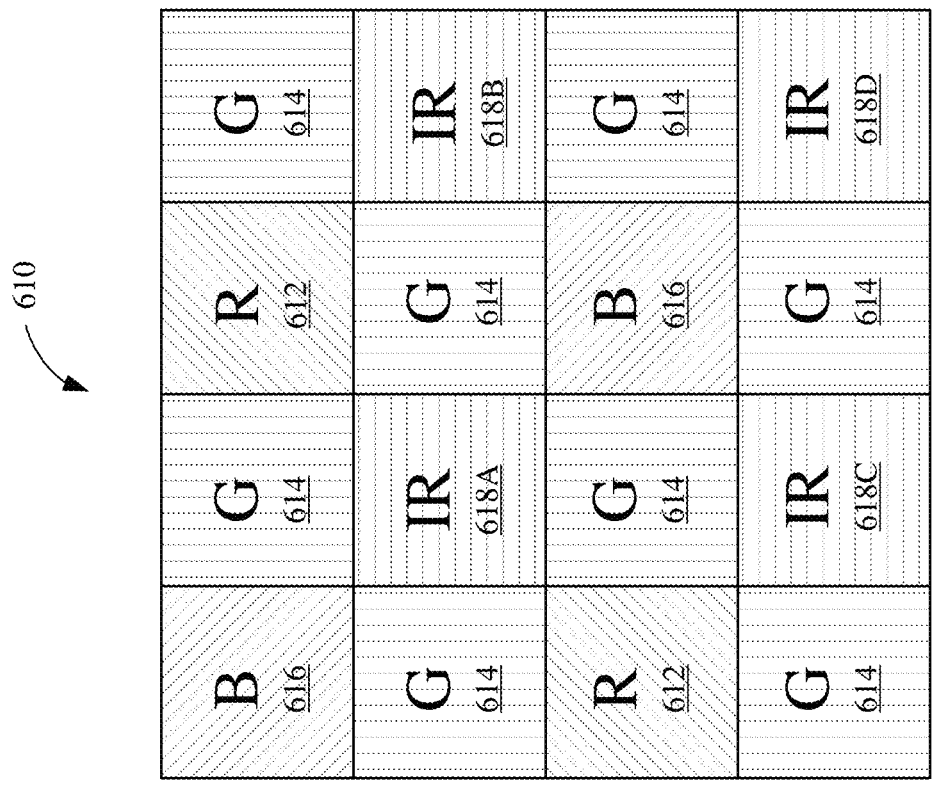
FIG. 6 is a depiction of an example 2×2 pixel pattern and an example 4×4 pixel pattern of an RGB-IR camera sensor.
Figure 6:
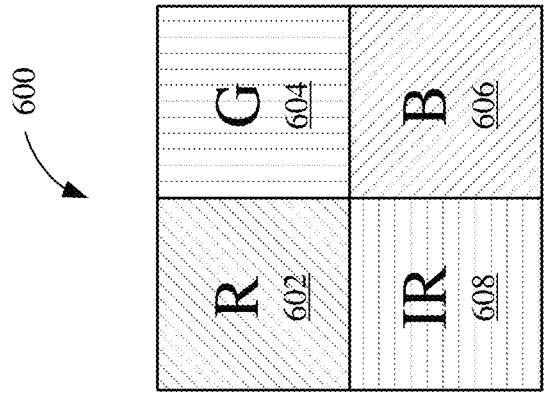

FIG. 6 is a depiction of an example 2×2 pixel pattern 600 and another example 2×2 pixel pattern 610 of an RGB-IR camera sensor. As shown in FIG. 4B, the Bayer CFA pattern includes a green color filter every other pixel location with a red color filter and a blue color filter alternating at the other pixel locations. As a result, the Bayer CFA pattern includes twice as many green color filters than red color filters or blue color filters.

The pixel pattern 600 includes an R pixel 602, a G pixel 604, a B pixel 606, and an IR pixel 608 configured to measure the intensity of IR light at the pixel. The pixel pattern 600 is similar to a Bayer pattern, except half the G pixels for a Bayer pattern are replaced with IR pixels. In this manner, the camera sensor includes an equal number of R pixels, G pixels, B pixels, and IR pixels.

The pixel pattern 610 includes R pixels 612, G pixels 614, B pixels 616, and IR pixels 618A-D configured to measure the intensity of IR light. Every other line of the pixel pattern 610 is the same as for a Bayer CFA pattern (e.g., RGBGRGBG . . . ). The other lines for the pixel pattern 610 include an IR pixel where an R pixel or a B pixel would exist for a Bayer CFA pattern. For example, IR pixel 618A is in place of an R pixel, IR pixel 618B is in place of a B pixel, IR pixel 618C is in place of an R pixel, and pixel IR 618D is in place of a B pixel for a Bayer pattern. In this manner, the pixel pattern 610 includes the same number of G pixels as a Bayer pattern, but both the number of R pixels and the number of B pixels are reduced by half.

Inclusion of IR pixels allows the PD operations to be performed using the camera sensor (such as described regarding FIG. 4A). Additionally, a camera sensor including IR pixels may be used for active depth sensing based on intensities of IR light emitted from the device. As the number of IR pixels increases in the camera sensor, the quality or number of PD operations may increase (such as the number or quality of depths determined via active depth sensing). In some implementations, the captured image data from the IR pixels of the camera sensor may be used to generate an IR image. Therefore, an increase in the number of IR pixels may increase a resolution of the generated IR image. However, increasing the number of IR pixels decreases the number of pixels coupled to color filters of the CFA. The reduction in color pixels may reduce the resolution of color images generated from the captured image data from the camera sensor.

Camera sensor pixels are decreasing in size to increase the resolution of the camera sensor without increasing the size of the camera sensor. As pixels decrease in size, less pixel space may exist for receiving light from the scene. Additionally, a CFA decreases the amount of light received at a camera sensor by filtering light outside of the wavelength range for each color filter. Therefore, the measured intensity of light at a smaller pixel with a color filter may be less than at a larger pixel without a color filter (such as for a camera sensor with larger pixels and coupled to clear color filters or no color filters). The reduced light intensity may cause a pixel receiving the light to have difficulty differentiating the received light from noise for low light environments, which may increase the difficulty in accurately determining an intensity and color for a corresponding image pixel. In this manner, the mosaic from the captured image data may include errors that cause artifacts in a generated image.

Figure 7:
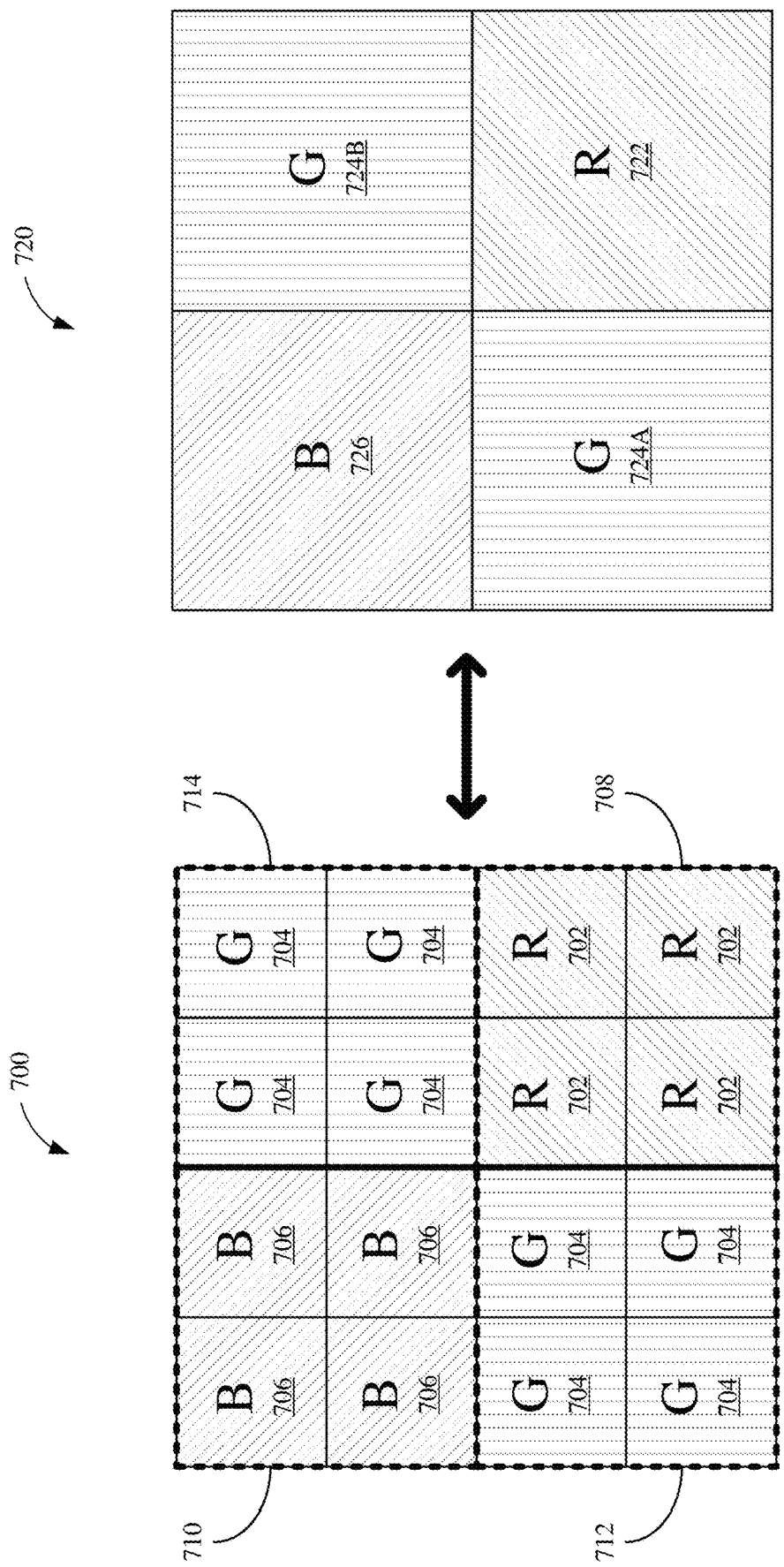
FIG. 7 is a depiction of an example 4×4 pixel pattern of a Quad CFA (QCFA) camera sensor.

Some cameras include a quad CFA (QCFA) camera sensor to generate high resolution images in non-low light environments and generate quality images (at a lower resolution) in low light environments. For example, for a 48 megapixel (MP) QCFA camera sensor, in non-low light environments, the QCFA camera sensor may be used to produce a mosaic of 48 million color values corresponding to the 48 million pixels of the camera sensor. In low light environments, the QCFA camera sensor may produce a mosaic of 12 million color values corresponding to one-fourth the number of pixels of the camera sensor. In remosaicing the captured image data (corresponding to a 48 MP mosaic) to a 12 MP mosaic, captured image data from each 2×2 sub-tile of pixels coupled to color filters of the same color may be binned to generate one image value of the mosaic. An example QCFA pattern is a quad Bayer pattern FIG. 7 is a depiction of an example 4×4 tile 700 of a quad Bayer camera sensor. The quad Bayer camera sensor may include 2×2 sub-tiles of pixels coupled to color filters of the same color. For example, sub-tile 708 may include four R pixels 702, sub-tile 710 may include four B pixels 706, sub-tile 712 may include four G pixels 704, and sub-tile 714 may include another four G pixels 704. Each sub-tile 708-714 may be referred to herein as a pixel cluster or a block.

The device 100 may be configured to concurrently expose each QCFA camera sensor pixel in a given pixel cluster for a rolling shutter. With concurrent exposure, each sensor pixel in a given pixel cluster can begin exposure at the same point in time and/or end exposure at the same point in time. Ending the exposure of the camera sensor pixels in a pixel cluster at the same time may enable the device 100 to concurrently read out the photocharges from each sensor pixel of a pixel cluster. For non-low light environments, individual photometrics may be used to determine individual colors of an image mosaic with the same resolution as the number of camera sensor pixels. For low light environments, camera sensor pixels of a pixel cluster may be binned so that the photometrics for the camera sensor pixels are combined (as illustrated by pattern 720 in FIG. 7). For example, B pixels 706 of the pixel cluster 710 may be binned to be equivalent to one B pixel 726 in the pattern 720, R pixels 702 of the pixel cluster 708 may be binned to be equivalent to one R pixel 722 in the pattern 720, G pixels 704 of the pixel cluster 712 may be binned to be equivalent to one G pixel 724A in the pattern 720, and G pixels 704 of the pixel cluster 714 may be binned to be equivalent to one G pixel 724B in the pattern 720. In the specific example depicted in FIG. 7, the device 100 may remosaic from a quad Bayer mosaic to a Bayer mosaic.

A mosaic corresponding to the pixel pattern of tile 700 and a mosaic corresponding to the pixel pattern 720 may be remosaiced between one another via binning. To bin, the device 100 may merge a plurality of original image values in a QCFA mosaic (such as a quad Bayer mosaic corresponding to the pattern of tile 700) into a new image value in a non-quad mosaic (such as a Bayer mosaic corresponding to the pattern 720). The device 100 may segment the QCFA mosaic into a plurality of image pixel clusters. Each image pixel cluster may have a common color channel. The device 100 may bin to merge each image pixel cluster into a new image value in the Bayer mosaic. During binning, the device 100 may sum the color values of the image pixels of a pixel cluster and divide by the number of summed color values to yield an averaged color value. The device 100 may then set the color value of the new image pixel as the averaged color value. In this way, binning may merge a plurality of original image pixels into a single new image pixel. In merging four image pixels, binning may reduce the resolution by 75 percent. For binning, the original image pixel values may refer to the analog photometrics after digital conversion. Alternatively, the original image pixel values may refer to the analog photometrics after digital conversion plus additional post-processing (e.g., color balancing).

A QCFA sensor (as well as other camera sensors) may include a sparse distribution of pixel pairs for PD (PD pairs). For example, three percent of the pixels may be PD pixels. PD pixels may be grouped and interspersed among imaging pixels (such as pixels for color imaging). As noted above, the PD pixels may be configured to capture image data from a first perspective and from a second perspective. For ease in explanation, the first and second perspectives may be referred to as a left perspective and a right perspective, respectively. However, the perspectives may be any suitable perspectives. As used herein, PD pixels are pixels that are configured for PD. In some implementations, PD pixels are also configured for imaging (such as for color imaging). As used herein, imaging pixels are pixels that are configured for imaging but are not configured for PD.

The PD pixels may be grouped into "left" PD pixels (to refer to PD pixels configured to capture image data from the left perspective) and "right" PD pixels (configured to capture image data from the right perspective). The left PD pixels and the rights PD pixels may be arranged in a repeating sparse pattern among the camera sensor pixels. A left perspective image may be generated from the captured image data from the left PD pixels, and a right perspective image may be generated from the captured image data from the right PD pixels. The device 100 may therefore detect phases and determine phase differences by comparing the left and right images. PD pairs of a camera sensor may have the same orientation or different orientations. For example, a first subset of PD pairs may have a first orientation corresponding the left and right PD pixels, and a second subset of PD pairs may a second orientation 90 degrees with respect to the first orientation (e.g., corresponding to a "bottom" perspective and a "top" perspective). PD pixels may also be referred to herein as focus pixels.

Figure 8A:
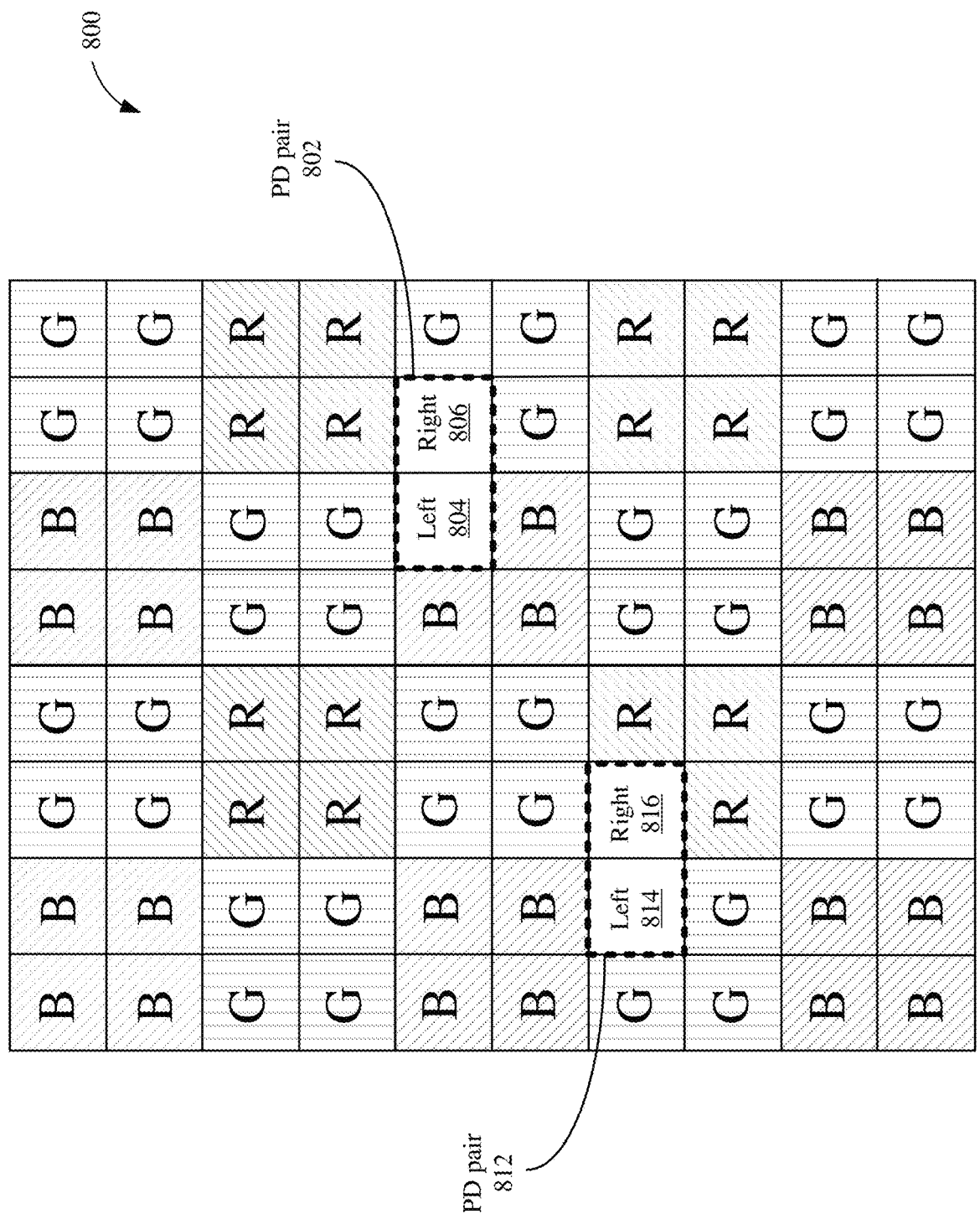
FIG. 8A is a depiction of an example 8×10 patch of pixels for a QCFA camera sensor including phase detection pairs.

FIG. 8A is a depiction of an example 8×10 patch of pixels 800 for a QCFA camera sensor including PD pairs 802 and 812. As shown, the PD pairs 802 and 812 are distributed such that every 4×4 tile of the QCFA camera sensor may not include a PD pair. The PD pair 802 includes a left PD pixel 804 and a right PD pixel 806, The PD pair 812 includes a left PD pixel 814 and a right PD pixel 816.

Figure 8B:
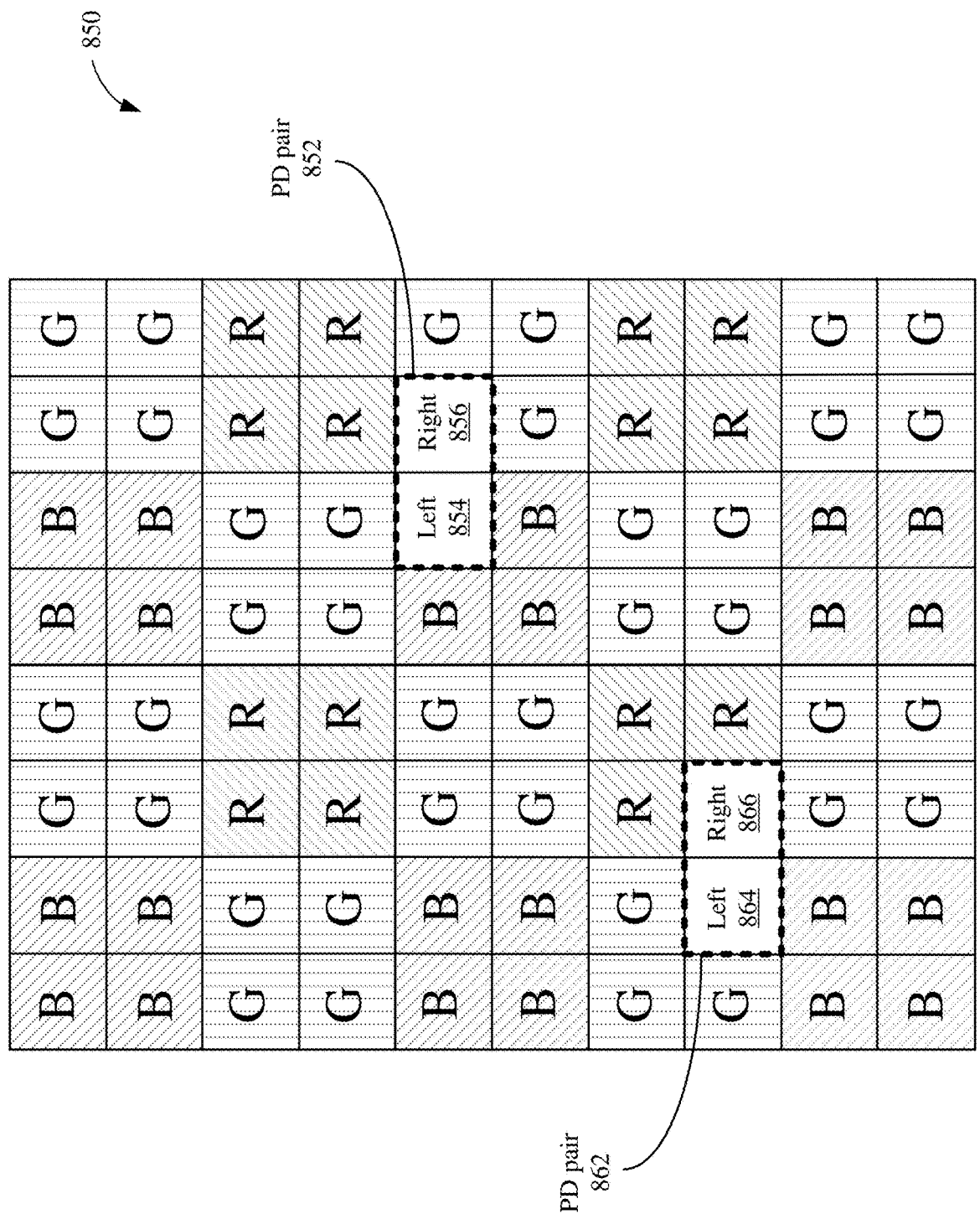
FIG. 8B is a depiction of another example 8×10 patch of pixels for a QCFA camera sensor including phase detection pairs.

FIG. 8B is a depiction of another example 8×10 patch of pixels 850 for a QCFA camera sensor including PD pairs 852 and 862. The PD pair 852 includes a left PD pixel 854 and a right PD pixel 856, and the PD pair 862 includes a left PD pixel 864 and a right PD pixel 866. The PD pairs 852 and 862 have more vertical separation from one another than the PD pairs 802 and 812 in FIG. 8A, but are similarly sparsely distributed.

The camera sensor including the PD pairs may allow the device 100 to perform PD operations (such as PDAF, depth sensing, etc.), but the sparse number of PD pairs limits the number of data points for PD. As a result, PD operations may not be as consistent as PD operations using a denser distribution of PD pairs. For example, the patches of the camera sensor in FIGS. 8A and 8B illustrate 6.25 percent of the pixels being PD pixels.

As noted herein, masks may be used to configure PD pixels to capture image data from different perspectives. In some other implementations, a microlens shared by the pixels of a PD pair may be used to configure the PD pixels to capture image data from different perspectives.

Figure 9A:
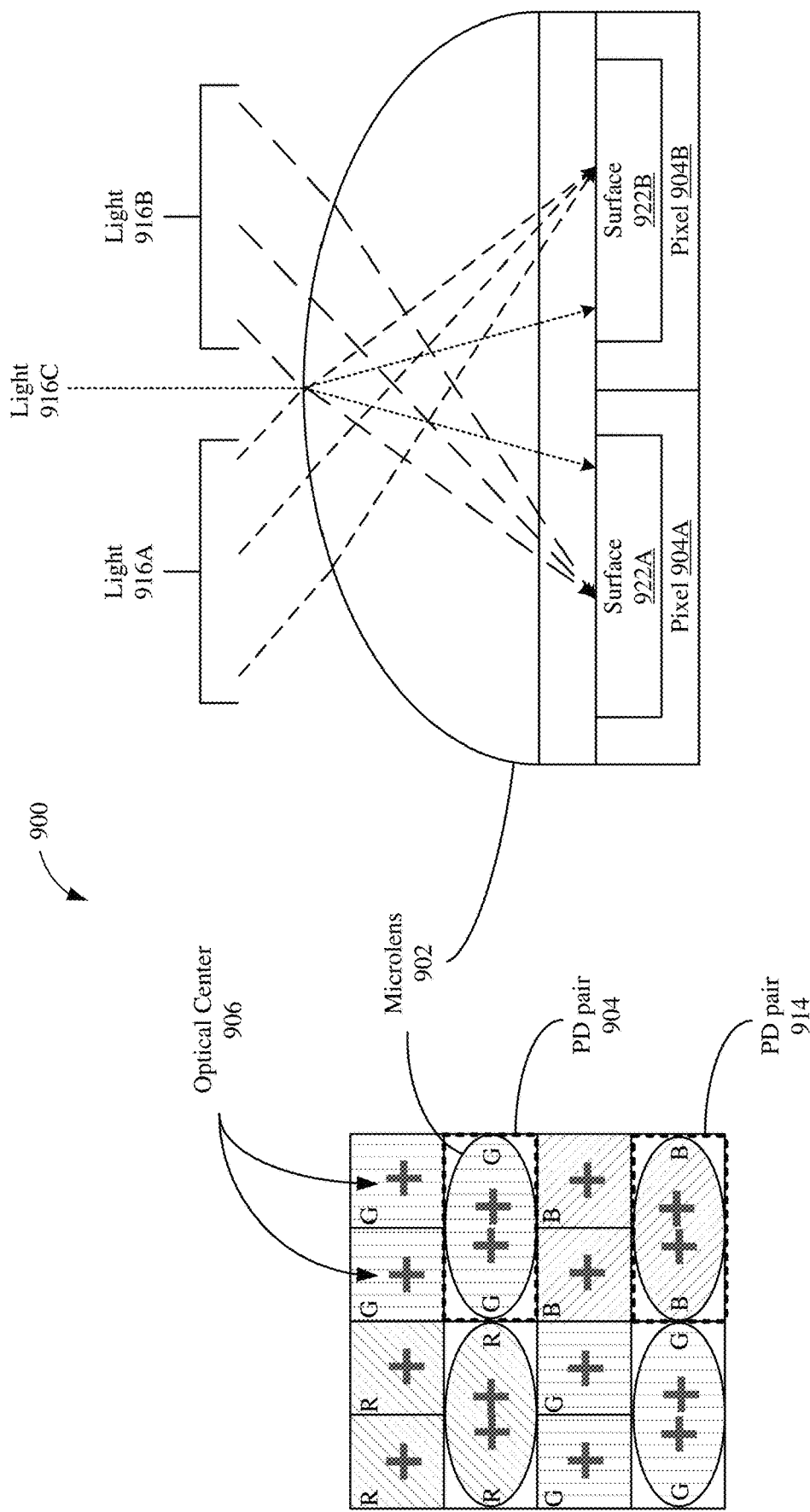
FIG. 9A is a depiction of a 4×4 tile of a camera sensor.

FIG. 9A is a depiction of a 4×4 tile 900 of a camera sensor. The tile 900 is coupled to a portion of a CFA with the pattern of tile 700 in FIG. 7. However, some of the pixels of the tile share a microlens, and characteristics of the shared microlens may be used to configure the pixels as PD pixels. In this manner, the R pixels, G pixels, and B pixels that are not part of PD pairs may include individual microlenses, and the PD pairs (such as PD pair 904) may include a shared microlens (such as shared microlens 902). Each of the microlenses (including the individual pixel microlenses and shared microlenses) may have a U-shaped design, and design imperfections in the U-shaped lenses may cause the optical center 906 (where light hits the pixel surface when an object is in focus) to be different than the physical center of each microlens. For example, the optical center 906 for each pixel in the tile 900 is indicated as a plus. As depicted, while theoretically the optical center for a PD pair should be the physical center of the PD pair and shared microlens, the imperfections in the microlens may cause an offset of the optical centers for each PD pixel of the PD pair. In this manner, the optical center from the perspective of a left PD pixel may be on the surface of the left PD pixel, and the optical center from the perspective of a right PD pixel may be on the surface of the right PD pixel. For example, the optical center from the perspective of the left pixel of the PD pair 904 is separated from the optical center from the perspective of the right pixel of the PD pixel pair 904. As a result, there exists resolution separation between the left PD pixels and right PD pixels of a PD pairs, and the resolution separation may be used for PD.

For example, the PD pixels 904A and 904B of the PD pair 904 may share a microlens 902 to direct light to the surfaces 922A and 922B of the PD pixels 904A and 904B, respectively. Light 916A from a first perspective may be directed by the microlens 902 to the surface 922B. Light 916B from a second perspective may be directed by the microlens 902 to the surface 922A. Portions of the light 916C may be directed by the microlens 902 to the surface 922A and the surface 922B. In this manner, the surfaces 922A and 922B receive light from a range of directions associated with a circle of confusion for the pixels.

As a result, captured image data from a first perspective by a first subset of PD pixels may be used to generate a first perspective image, and captured image data from a second perspective by a second subset of PD pixels may be used to generate a second perspective image. The device 100 may compare the images to detect phases and determine phase differences.

As noted herein, the PD pixels may be coupled to clear color filters (which may be referred to as a C pixel), may be configured to receive IR light (which may be referred to as an IR pixel), or may be coupled to a color filter of the CFA. In some implementations, PD pixels may include color filters for capturing image data for color imaging as well as for PD. For example, pairs of R pixels, pairs of G pixels, or pairs of B pixels may share a microlens and be used for PD. PD pair 904 is depicted as including two G pixels. PD pair 914 is depicted as including two B pixels. In some implementations, a clear color filter or no color filter is used to allow more light to reach the PD pixel surfaces.

Figure 9B:
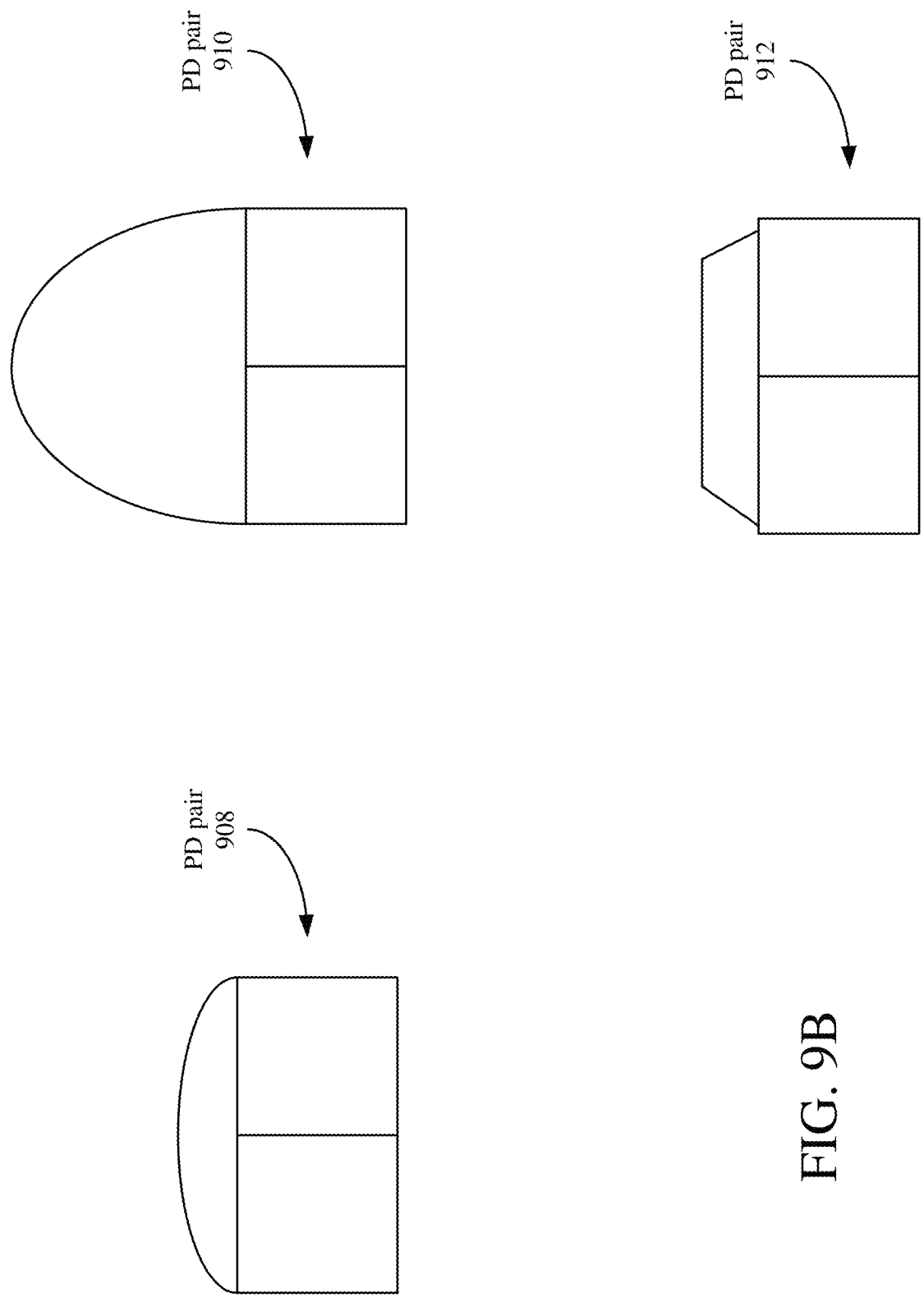
FIG. 9B is a depiction of example shapes of shared microlenses for phase detection pairs.

While the microlenses in the previous examples are illustrated as U shaped, a shared microlens may be of any suitable shape. FIG. 9B is a depiction of example microlens shapes for PD pairs. The microlens for the PD pair 908 may have a lower peak than the microlens 902, the microlens for the PD pair 910 may have a higher peak than the microlens 902, and the microlens for the PD pair 912 may be trapezoidal or mesa-like as compared to the U-shaped microlens 902. Imperfections in the microlenses still cause resolution separation between the left PD pixels and right PD pixels of a PD pair. However, the resolution separation may be affected by the microlens design, and for some microlenses, a typical QCFA remosaicing may be used to remosaic between, e.g., a quad Bayer image mosaic and a Bayer image mosaic. Any suitable microlens shape may be used, and the present disclosure is not limited to the provided examples.

While PD pixels have been described regarding capturing image data for PD, the captured image data from PD pixels may also be used to generate black and white images (or otherwise monochromatic images based on the color filters coupled to the PD pixels). In addition, captured image data of a sub-tile including a PD pixel not coupled to a color filter may be used to interpolate an image value for the PD pixel. In some implementations, the camera sensor may be a modified quad Bayer camera sensor including a plurality of 4×4 tiles, with each tile including four 2×2 sub-tiles. The quad Bayer CFA coupled to the camera sensor may make the first sub-tile associated with red color light, the second and third sub-tiles associated with blue color light, and the fourth sub-tile associated with green color light. Additionally, each tile includes at least one PD pair sharing a microlens. In this manner, the PD pixels (with a shared microlens) may be distributed densely enough in the camera sensor to allow for denser PD operations.

Figure 10A:
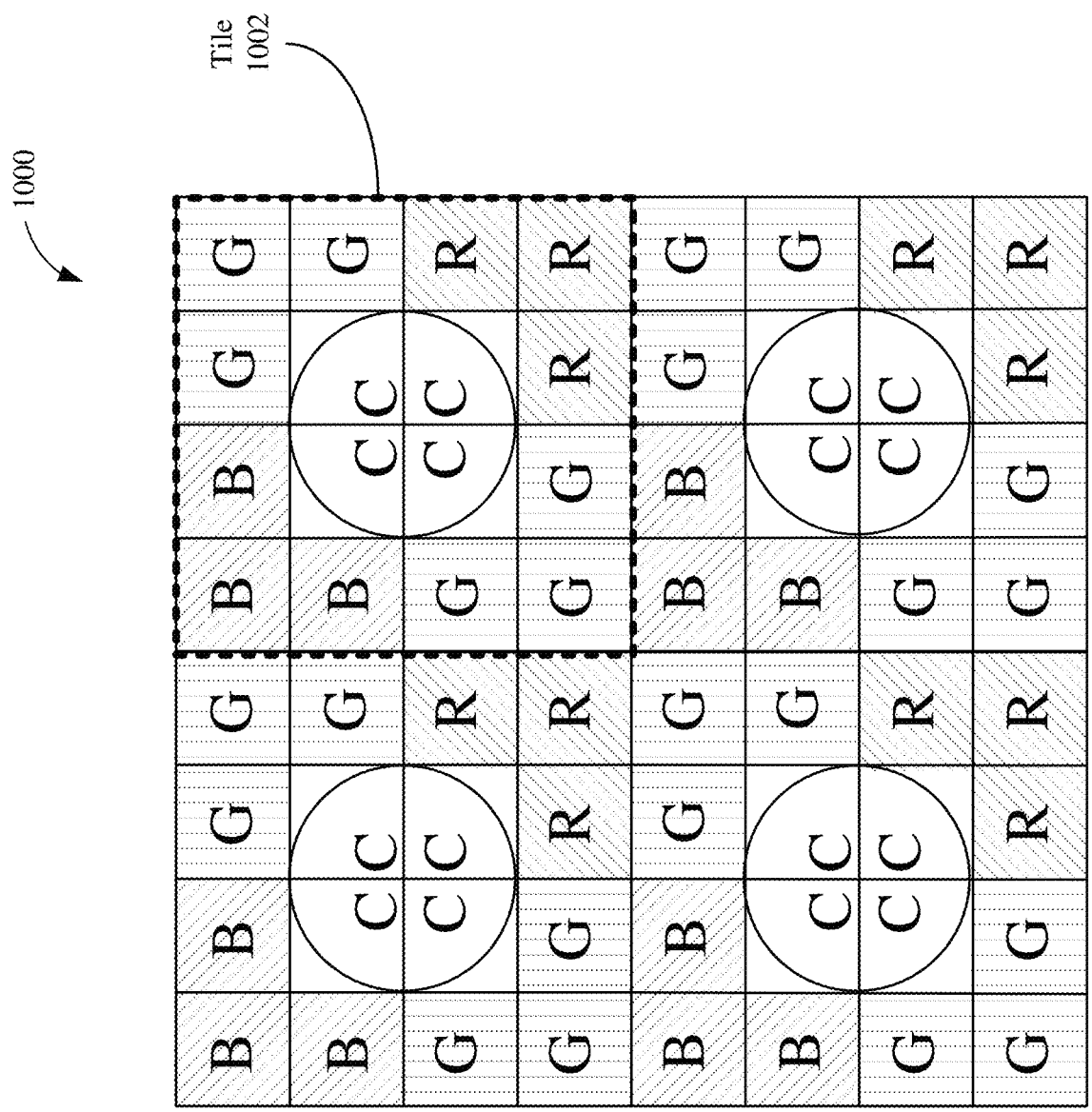
FIG. 10A is a depiction of an example 8×8 pixel patch of a modified quad Bayer camera sensor.

FIG. 10A is a depiction of an example 8×8 patch of pixels 1000 of a modified quad Bayer camera sensor. The camera sensor includes R pixels, G pixels, and B pixels in an arrangement similar to a quad Bayer pattern. The camera sensor also includes PD pixels coupled to a clear color filter or no filter (C pixels). The patch 1000 may include four 4×4 tiles. As shown, the tile 1002 is a 4×4 tile including sub-tiles similar to the pattern of tile 700 in FIG. 7, but one pixel of each sub-tile includes a C pixel coupled to a shared microlens. While the PD pixels are illustrated as coupled to a clear color filter or no filter, a PD pixel may be coupled to any suitable filter (including a color filter of the CFA), and the disclosure is not limited to the provided example. The camera sensor including a plurality of patches 1000 may be configured for use in generating black and white images, generating color images, and performing PD operations.

Figure 10B:
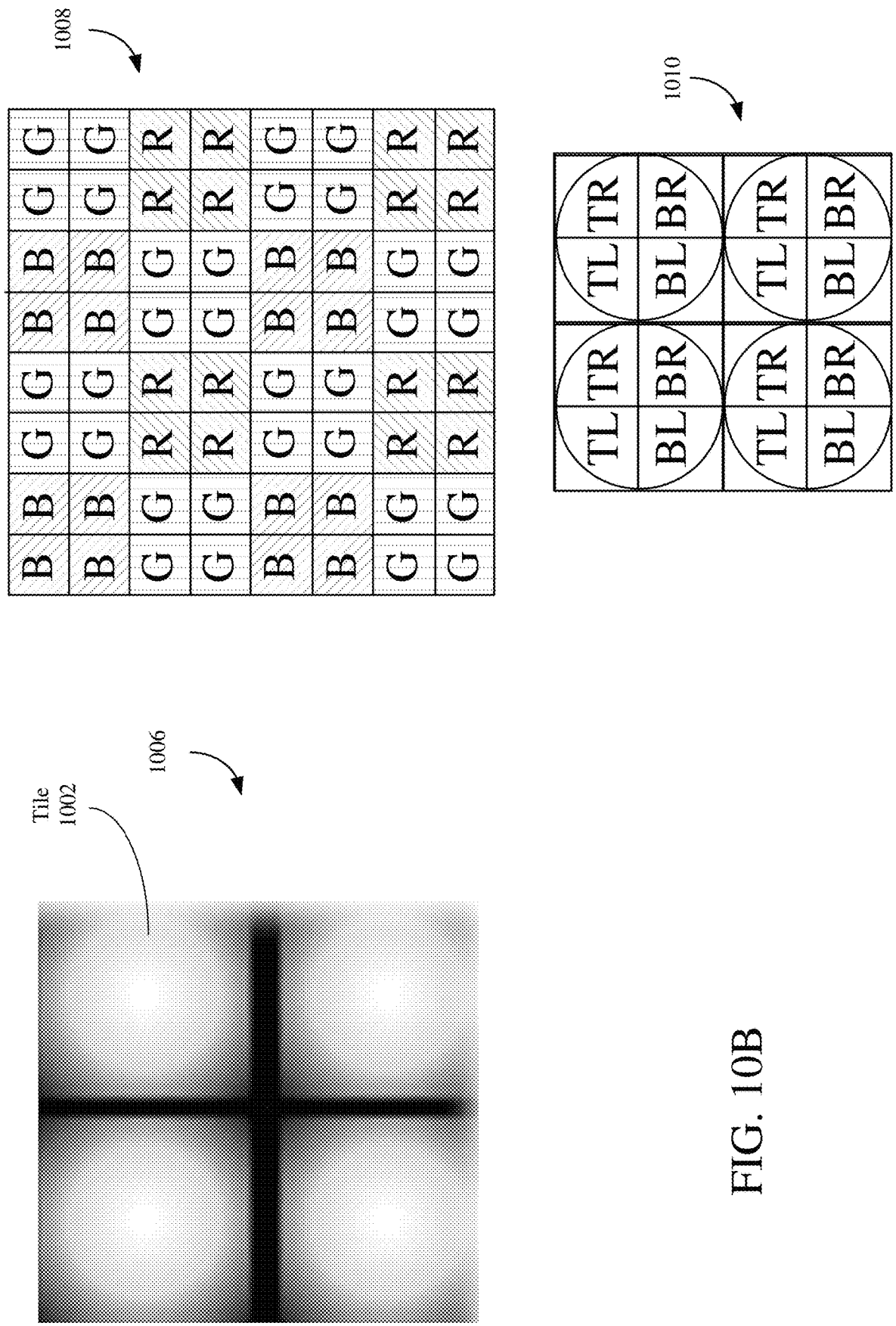
FIG. 10B is a depiction of captured image data associated with the patch in FIG. 10A for different images that may be generated and operations that may be performed.

FIG. 10B is a depiction of captured image data associated with the patch 1000 in FIG. 10A for different images that may be generated and operations that may be performed. As shown in the patch 1000 in FIG. 10A, the PD pixels of each tile are coupled to a clear color filter. In this manner, the PD pixel surfaces are able to receive more frequencies of light than if coupled to a color filter. Therefore, the device 100 may use captured image data from the PD pixels to generate a black and white image, which may be useful in scenes with low amounts of ambient light.

The captured image data from each PD pixel may be one value in a black and white image mosaic for the camera sensor. In this manner, the mosaic's resolution is 25 percent of the number of pixels in the camera sensor. In even lower light scenarios, the captured image data from the PD pixels sharing a microlens may be binned to generate a black and white image. In this manner, one image value may be generated per tile in the camera sensor (with the resolution of the image being 6.25 percent the number of pixels in the camera sensor). Depiction 1006 illustrates the captured image data of the patch 1000 (FIG. 10A), including the captured image data for the tile 1002. As shown, the PD pixels coupled to the clear color filters receive more light than the other pixels in the patch, and as such may be used for black and white imaging in low light situations.

The camera sensor may also be used similar to a quad Bayer camera sensor or remosaiced to simulate a Bayer camera sensor for generating color images. Depiction 1008 shows image data for the patch 1000 (FIG. 10A) for use in generating a color image using a quad Bayer mosaic. As shown, the B pixels capture blue image data, the R pixels capture red image data, and the G pixels capture green image data. The C pixels are shown as capturing image data of the color associated with the other pixels in the sub-tile of the C pixel. In some implementations, the device 100 may use the captured color image data from the imaging pixels in a sub-tile (and optionally the captured non-color image data from the PD pixel in the sub-tile) to determine a simulated captured color image data for the PD pixel. For example, the device 100 may average the capture image data values from the three imaging pixels to generate an image data value for the PD pixel. In some implementations, the value may be adjusted based on a captured image data value from the PD pixel (which may, e.g., indicate the overall intensity of the lighting in the scene). In some other implementations, the device 100 may interpret the photometric for a C pixel to the color of the filters for the corresponding sub-tile. For example, a C pixel in a G sub-tile may have its corresponding photometric translated to a green color value (such as via a LUT, a conversion operation, based on the light intensities sensed at the imaging pixels in the sub-tile, etc.). As depicted in FIG. 7, the quad Bayer mosaic may be remosaiced to a Bayer mosaic through binning.

The device 100 may also use the captured image data from the PD pixels for PD operations. If four PD pixels (in a 2×2 arrangement) share a microlens (such as the four C pixels in tile 1002 in FIG. 10A), the device 100 may associate the four PD pixels with at least one of four possible PD pairs. For example, four C pixels sharing a microlens may correspond to a top PD pair and a bottom PD pair. The four C pixels sharing a microlens may also corresponding to a left PD pair and a right PD pair. Depiction 1010 in FIG. 10B shows the captured image data for the four groups of PD pixels sharing a microlens in the patch 1000 in FIG. 10A. The top PD pair from the four PD pixels sharing a microlens may include a TL pixel configured to capture image data from a left perspective and a TR pixel configured to capture image data from a right perspective. The bottom PD pair from the four PD pixels sharing the microlens may include a BL pixel configured to capture image data from a left perspective and a BR pixel configured to capture image data from a right perspective. The left PD pair from the four PD pixels sharing the microlens may include a TL pixel configured to capture image data from a top perspective and a BL pixel configured to capture image data from a bottom perspective. The right PD pair from the four PD pixels sharing the microlens may include a TR pixel configured to capture image data from a top perspective and a BR pixel configured to capture image data from a bottom perspective. As a result, each tile of the camera sensor (such as tile 1002 in FIG. 10A) may be associated with four logical PD pairs.

Figure 11:
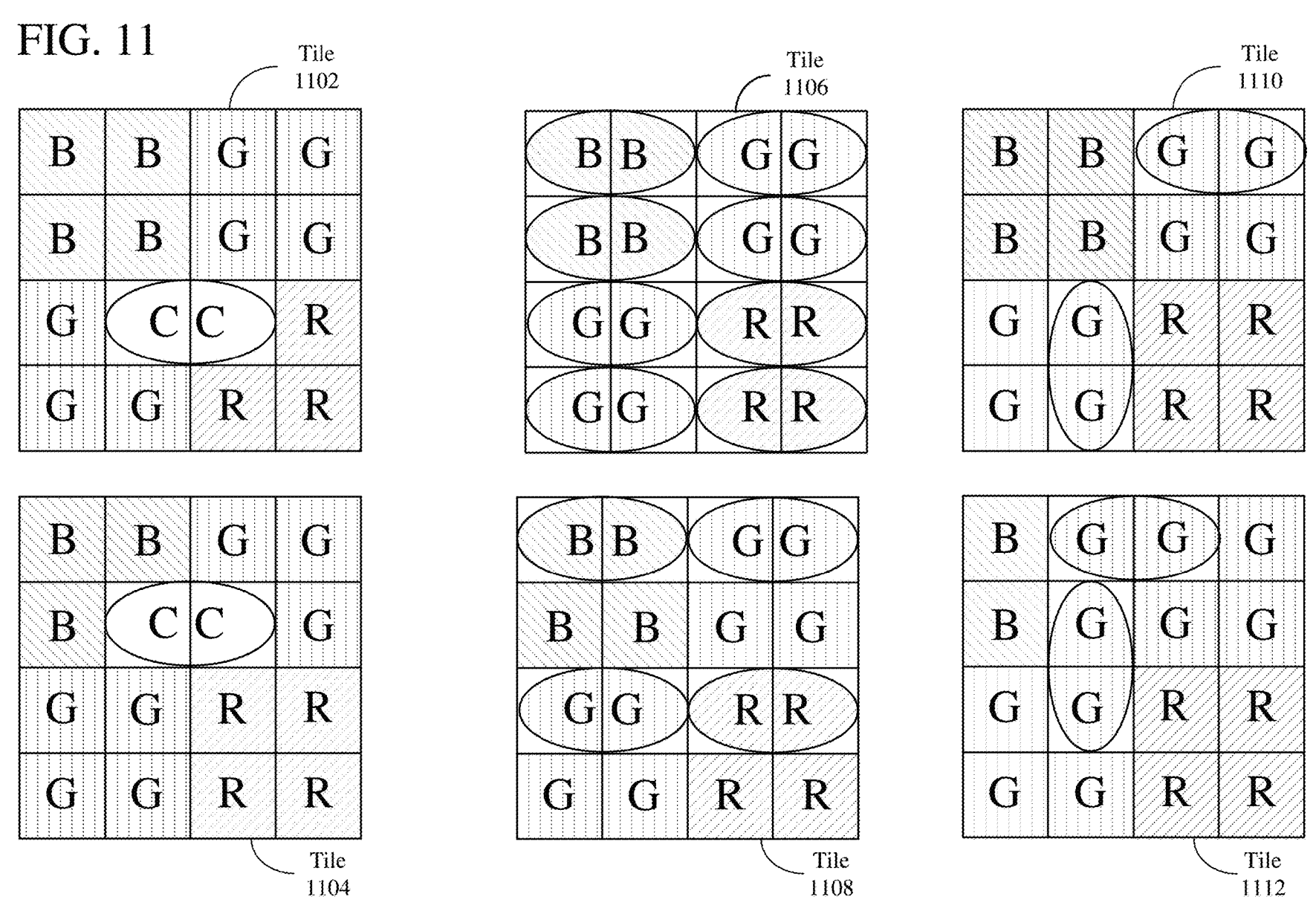

Configurations for a modified quad Bayer camera sensor other than depicted in FIG. 10A may exist. FIG. 11 is a depiction of example tiles 1102-1112 that may be included in a modified quad Bayer camera sensor. The tile 1102, as compared to tile 1002 in FIG. 10A, includes two C pixels sharing a microlens, replacing a G pixel and an R pixel from a quad Bayer pattern. The tile 1104, as compared to tile 1102, includes two C pixels replacing a G pixel and a B pixel (instead of a G pixel and an R pixel). The modified QCFA camera sensor may including a repeating pattern of tiles 1102, a repeating pattern of tiles 1104, or a pattern including both tiles 1102 and 1104 (or also including tile 1002 in FIG. 10A). For example, the camera sensor may include a pattern of alternating tiles 1102 and 1104.

Alternative to the camera sensor including PD pixels coupled to a clear color filter or no color filter (such as the C pixels in tiles 1102 and 1104), pairs of R pixels, B pixels, or G pixels may share a microlens to be a PD pair. Tile 1106 is an example configuration where each pixel shares a microlens for PD. Each sub-tile includes two pairs of pixels coupled to a same color filters and sharing microlenses. Alternatively, a sub-tile may include only one lens shared by two pixels of the sub-tile. Tile 1108 is an example configuration where only two pixels of each sub-tile share a microlens for PD. While tile 1106 and tile 1108 depict the microlenses in a first orientation (e.g., horizontal), at least some of the microlenses may be in a second orientation (e.g., vertical).

Tiles 1110 and 1112 are example tiles where G pixels are PD pixels. Since the color green is near the center of the visible light spectrum, visible light many times includes green color components. As a result, G pixels as PD pixels may be more beneficial that R PD pixels or B PD pixels. Tile 1110 illustrates shared microlenses with changing the color filter arrangement for a quad Bayer CFA. Tile 1112 illustrates B pixels (or R pixels in other implementations) being replaced with G pixels for PD pairs sharing microlenses. In some implementations, the pattern of tiles may alternate between replacing B pixels with G pixels and replacing R pixels with G pixels. In this manner, the number of R pixels and the number of B pixels of the camera sensor may be approximately the same. Other example implementations of tiles and configurations of shared microlenses or PD pairs may exist, and the disclosure is not limited to the provided examples. For example, any PD pair shown in the horizontal orientation may be in the vertical orientation, and vice versa.

While the example PD pixels have been shown to be coupled to a clear color filter, no filter, or a red, green, or blue color filter, in some implementations, the camera sensor may include IR pixels as PD pixels. For example, some or all of the C pixels (as illustrated in FIGS. 10 and 11) may be replaced with IR pixels that share a microlens. IR pixels may be pixels coupled to an IR filter and/or pixels including a photodiode configured to sense IR light.

Figure 12:
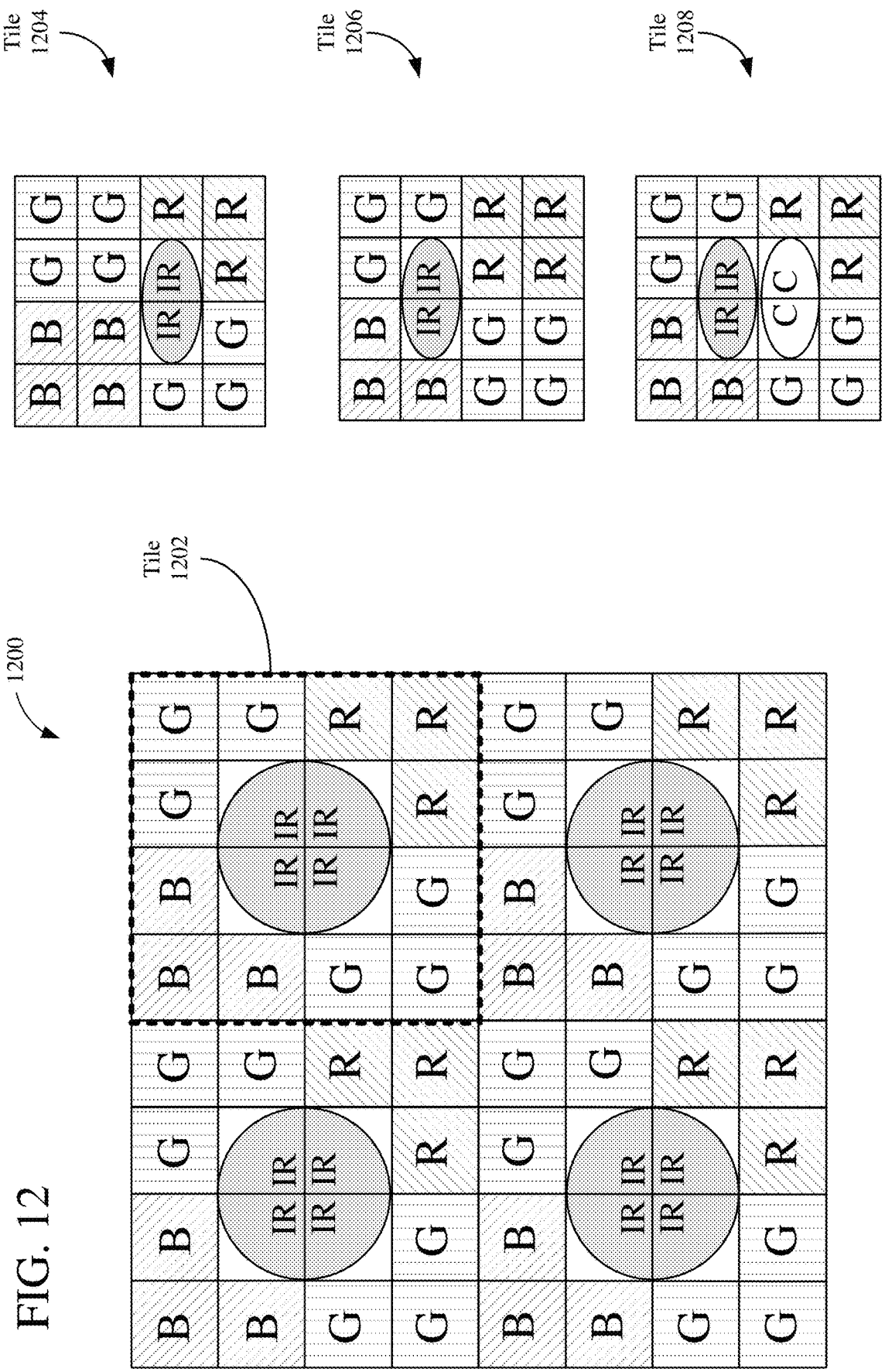
FIG. 12 is a depiction of a patch of four tiles of a modified quad Bayer camera sensor.

FIG. 12 is a depiction of a patch 1200 of four tiles of a modified quad Bayer camera sensor. As compared to patch 1000 in FIG. 10A, the C pixels in patch 1000 may be replaced with IR pixels for patch 1200. In this manner, four IR pixels may share a microlens. Similar to the example tiles in FIGS. 10A and 11, any suitable configuration of IR pixels in the tile may exist. For example, tiles 1204-1208 are examples where the tile includes only one IR PD pair. In some implementations, a tile may include a C PD pair and an IR PD pair, e.g., as illustrated by tile 1208.

In some implementations, the IR pixels may be configured to capture image data based on ambient IR light in a scene. In some other implementations, the IR pixels may be configured to capture image data for active depth sensing. For example, a projector 120 may emit IR light. For example, the projector 120 may be a structured light projector. In some other example implementations, the projector 120 may emit diffuse IR light or other types of IR light (such as AMCW, pulsed IR light, etc.).

Figure 13:
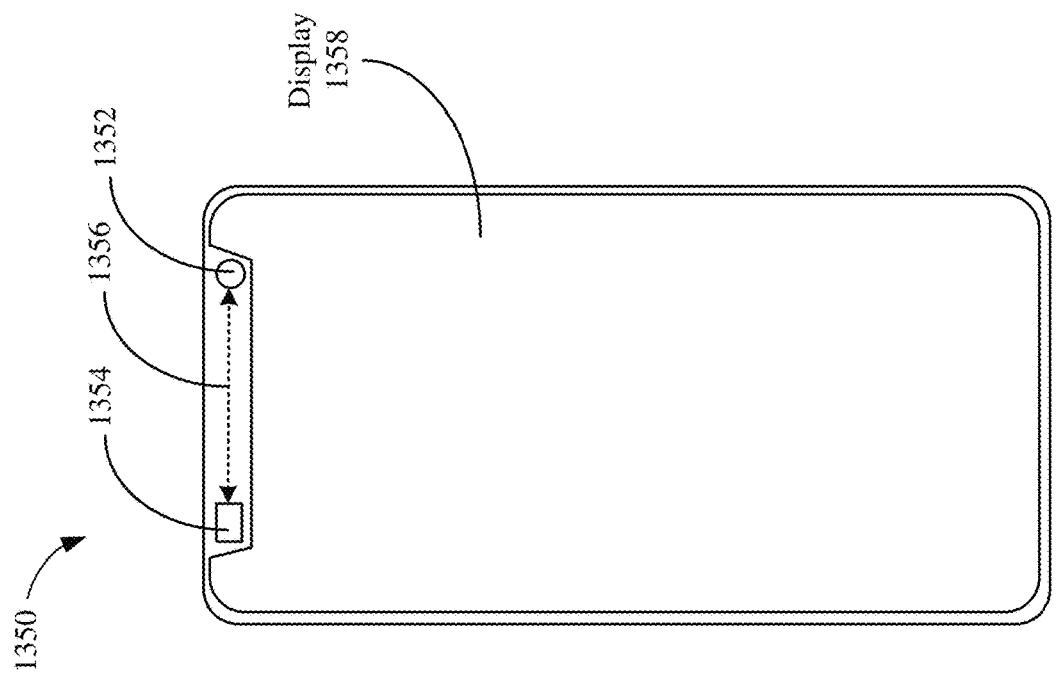
FIG. 13 is a depiction of example devices (such as a smartphone) including an infrared (IR) projector, such as a structured light projector or a diffuse IR emitter.
Figure 13:
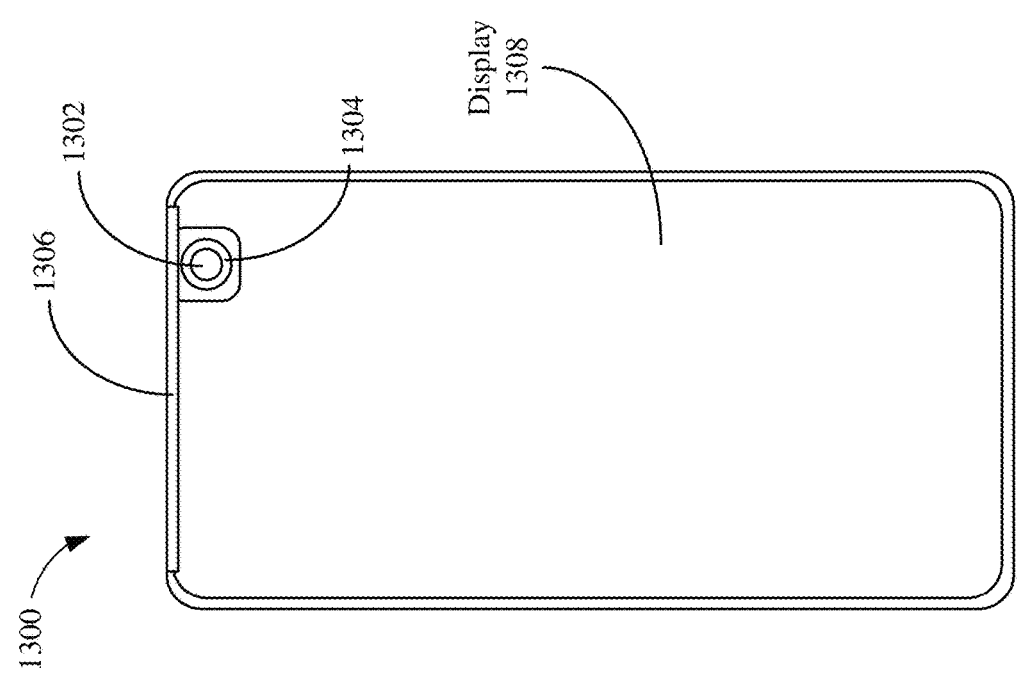

FIG. 13 is a depiction of example devices 1300 and 1350 (such as a smartphone) including an IR projector, such as a structured light projector or a diffuse IR emitter. The device 1300 includes at least one camera 1302 with a modified QCFA camera sensor (such as a modified quad Bayer camera sensor) including IR PD pixels. The device 1300 may include a diffuse IR emitter 1304 located around the aperture for the camera 1302 and/or an IR emitter 1306 which may be located on an edge of the device 1300. In some other implementations, the device 1300 may incorporate the IR emitter into the display 1308. For example, the display 1308 may include an IR backlight. In another example, the display 1308 may include one or more IR light emitting diodes (LEDs), such as organic LEDs (OLEDs) as part of the display matrix of LEDs.

The device 1350 includes at least one camera 1352 with a modified QCFA camera sensor including IR PD pixels. The device 1350 may include a structured light IR projector 1354 located a baseline 1356 from the camera 1352. In some implementations, the camera 1352 and the IR projector 1354 may be included in a notch of the display 1358. For example, the camera 1352 and the IR projector 1354 may be disposed at opposite ends of the notch, separated by the baseline 1356. In some other implementations, one or more of the IR projector 1354 or the camera 1352 may be located on a portion of the device 1350 hidden behind the display 1358 when not in use. For example, when the device is to use the projector 1354 and/or the camera 1352, the hidden portion of the device 1350 including the components may pop out from behind the display 1358. In this manner, the device 1300 may be configured to perform structured light depth sensing in addition to other PD operations.

As described herein a modified QCFA camera sensor may be configured for the device 100 to perform color imaging based on, e.g., a quad Bayer mosaic or a Bayer mosaic, black and white image based on the captured image data from the PD pixels (if coupled to clear color filters, no color filters, or green color filters), IR imaging (if the PD pixels are IR pixels), and PD (such as for depth sensing, PDAF, or other depth related operations).

While clear pixels and IR pixels are described as replacing one or more color pixels in a tile of the camera sensor, the pixels may be of any color that is not part of the QCFA. For example, the substituted pixels may be light green pixels (with a light green color filter), yellow pixels (with a yellow color filter), white pixels (with a visible color spectrum filter, or any other suitable camera sensor pixels. The depiction and description of clear and IR pixels are for illustrative purposes, and the examples do not limit the scope of the disclosure to specific types of pixels for a modified QCFA camera sensor.

In some implementations, the device 100 may also be configured to perform HDR processing (such as three frame HDR (3HDR) processing) based on one frame of captured image data from the camera sensor. Referring back to FIG. 10A, each sub-tile of a tile includes three imaging pixels. For example, each B 2×2 sub-tile includes three B pixels, each G 2×2 sub-tile includes three G pixels, and each R 2×2 sub-tile includes three R pixels. The device 100 may be configured to control the exposure settings of the pixels independent from one another. For example, each B pixel in a B sub-tile may have different exposure settings when capturing image data during a frame. Different exposure settings may include, for example, the length of the exposure window, the sensitivity of the photodiode or photosensitive surface of a pixel, etc. In this manner, the device 100 may simulate capturing three frames with different exposure settings during one frame of capturing image data.

For example, a first B pixel of each B sub-tile, a first R pixel of each R sub-tile, and a first G pixel of each G sub-tile may include the same exposure settings and be associated with a first frame for 3HDR imaging. A second B pixel of each B sub-tile, a second R pixel of each R sub-tile, and a second G pixel of each G sub-tile may include the same exposure settings (different from the exposure settings for the first B, G, and R pixels of the sub-tiles) and be associated with a second frame for 3HDR imaging. A third B pixel of each B sub-tile, a third R pixel of each R sub-tile, and a third G pixel of each G sub-tile may include the same exposure settings (different from the exposure settings for the first and second B, G, and R pixels) and be associated with a third frame for 3HDR imaging. In this manner, the mosaic for each simulated frame for 3HDR imaging is 25 percent the resolution of the number of pixels of the camera sensor (i.e., one captured image data value for each 2×2 sub-tile in the camera sensor for each of the three simulated frames). The device 100 may then combine the simulated frames of captured image data to generate a 3HDR image. Other means of performing HDR imaging may be included, and the device 100 is not limited to a specific example for performing HDR imaging. Additionally, other imaging operations may be performed by the device 100 using the camera sensor, and the present disclosure is not limited to a specific example or implementation.

As noted, the device 100 may control the exposure settings of pixels within a sub-tile independently from one another (such as differing exposure windows between pixels). FIG. 14 is an illustrative flow chart depicting an example operation 1400 for controlling the exposure settings of different pixels of a sub-tile of a modified QCFA camera sensor (such as a modified quad Bayer camera sensor). The sub-tile may include a first PD pixel (such as a C pixel, an IR pixel, etc. sharing a microlens with another pixel of the tile) and a first imaging pixel (such as a B pixel, R pixel, or G pixel coupled to a different microlens and not sharing the microlens with the first PD pixel).

Beginning at 1402, the device 100 may control one or more first exposure settings of the first PD pixel. For example, the image signal processor 112 or the processor 104 may adjust or set the exposure time, exposure window, instruct the camera 102 to adjust or set the pixel sensitivity, etc. of the first PD pixel. The device may also control one or more second exposure settings, independent from controlling one or more first exposure settings, of the first imaging pixel (1404). For example, the image signal processor 112 or the processor 104 may adjust or set the exposure time, exposure window, instruct the camera 102 to adjust or set the pixel sensitivity, etc. of the first imaging pixel. The exposure settings to be controlled may be determined in any suitable manner. For example, one or more predetermined or preset exposure settings (such as an exposure time, an exposure window, and/or a pixel sensitivity) may be applied. In another example, the device 100 may perform an auto-exposure operation to determine one or more exposure settings to be applied.

In some examples, if the device 100 is to perform 3HDR imaging, the device 100 may adjust the exposure settings of the imaging pixels of each sub-tile to simulate capturing image data for three frames (such as applying different exposure times, different exposure windows, or different pixel sensitivities to each imaging pixel of a sub-tile). If the device 100 is to perform a PD operation, the device 100 may adjust or control the exposure settings of the PD pixels to capture image data for PD (such as applying a preset exposure time, exposure window, or pixel sensitivity different than for when the PD pixel is used for imaging). If the device 100 is to perform IR imaging, black and white imaging, etc. based on captured image data from the PD pixels, the device 100 may adjust or control the exposure settings of the PD pixels to capture the image data for imaging (which may be preset for each imaging mode, determined using an auto-exposure operation for the imaging mode, or in an suitable manner). As used herein, controlling an exposure setting of a pixel refers to one or more of determining/setting the exposure setting for the pixel, adjusting the exposure setting for the pixel, or applying the exposure setting for the pixel.

The device 100 may then receive the captured image data from the camera 102 (1406). In some implementations, the captured image data is based on at least one of the one or more first exposure settings or the one or more second exposure settings. For example, the camera 102 may use the modified QCFA camera sensor to capture image data using the exposure settings. If the device 100 is performing IR imaging, a PD operation, black and white imaging, or another operation based on captured image data from the PD pixels, the captured image data may include captured image data from the PD pixels (including the first PD pixel), and the captured image data may be based on at least the one or more first exposure settings. If the device 100 is performing a color imaging operation (such as based on a quad Bayer mosaic or a Bayer mosaic, or performing HDR imaging), the captured image data may include captured image data from the imaging pixels (including the first imaging pixel), and the captured image data may be based on at least the one or more second exposure settings.

In this manner, the device 100 may perform PD operations (including PDAF and depth sensing), color imaging operations for various light conditions (including remosaicing between a quad Bayer mosaic and a Bayer mosaic), black and white or IR imaging operations, etc. using one camera sensor. Additionally, the photosensitive surfaces of the camera sensor pixels are not required to be divided into multiple surfaces for a pixel, and the camera sensor may be more cost effective and easier to produce than, e.g., a dual pixel camera sensor.

The techniques described herein may be implemented in hardware, software, firmware, or any combination thereof, unless specifically described as being implemented in a specific manner. Any features described as modules or components may also be implemented together in an integrated logic device or separately as discrete but interoperable logic devices. If implemented in software, the techniques may be realized at least in part by a non-transitory processor-readable storage medium (such as the memory 106 in the example device 100 of FIG. 1) comprising instructions 108 that, when executed by the processor 104, the camera controller 110, or the image signal processor 112, cause the device 100 to perform one or more of the methods described above. The non-transitory processor-readable data storage medium may form part of a computer program product, which may include packaging materials.

The non-transitory processor-readable storage medium may comprise random access memory (RAM) such as synchronous dynamic random access memory (SDRAM), read only memory (ROM), non-volatile random access memory (NVRAM), electrically erasable programmable read-only memory (EEPROM), FLASH memory, other known storage media, and the like. The techniques additionally, or alternatively, may be realized at least in part by a processor-readable communication medium that carries or communicates code in the form of instructions or data structures and that can be accessed, read, and/or executed by a computer or other processor.

The various illustrative logical blocks, modules, circuits and instructions described in connection with the embodiments disclosed herein may be executed by one or more processors, such as the processor 104 or the image signal processor 112 in the example device 100 of FIG. 1. Such processor(s) may include but are not limited to one or more digital signal processors (DSPs), general purpose microprocessors, application specific integrated circuits (ASICs), application specific instruction set processors (ASIPs), field programmable gate arrays (FPGAs), or other equivalent integrated or discrete logic circuitry. The term "processor," as used herein may refer to any of the foregoing structures or any other structure suitable for implementation of the techniques described herein. In addition, in some aspects, the functionality described herein may be provided within dedicated software modules or hardware modules configured as described herein. Also, the techniques could be fully implemented in one or more circuits or logic elements. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

While the present disclosure shows illustrative aspects, it should be noted that various changes and modifications could be made herein without departing from the scope of the appended claims. For example, while not always illustrated, each camera sensor pixel no sharing a microlens may be coupled to its own microlens. In another example, while not shown, the size of the photosensitive surfaces may differ between pixels in the camera sensor. In a further example, masks may be used for at least some of the PD pairs to configure the PD pixels to capture image data from different perspectives.

Additionally, the functions, steps or actions of the method claims in accordance with aspects described herein need not be performed in any particular order unless expressly stated otherwise. For example, the steps of the described example operations, if performed by the device 100, such as the camera controller 110, the processor 104, and/or the image signal processor 112, may be performed in any order and at any frequency. Furthermore, although elements may be described or claimed in the singular, the plural is contemplated unless limitation to the singular is explicitly stated. Accordingly, the disclosure is not limited to the illustrated examples and any means for performing the functionality described herein are included in aspects of the disclosure.

What is claimed is:

1. A device, comprising:
a camera configured to capture image data, the camera comprising:
 a camera sensor including a plurality of tiles of four pixels by four pixels, wherein each tile includes a first sub-tile, a second sub-tile, a third sub-tile, and a fourth sub-tile of two pixels by two pixels; and
 a quad color filter array (QCFA) coupled to the camera sensor, the QCFA including a plurality of red color filters, a plurality of green color filters, and a plurality of blue color filters;
wherein a first sub-tile of a first tile includes:
 a first phase detection (PD) pixel coupled to a first microlens shared with at least one other pixel of the first tile, wherein the first microlens includes a first orientation with respect to the camera sensor and is shared by the first PD pixel and a second PD pixel of the first sub-tile, and wherein the first PD pixel is coupled to a first green color filter and the second PD pixel is coupled to a second green color filter; and a first imaging pixel coupled to a second microlens different from the first microlens, wherein the first imaging pixel is coupled to a third green color filter of the QCFA;

wherein the second sub-tile includes:

a third PD pixel coupled to a fourth green color filter and a third microlens, wherein the third microlens includes a second orientation 90 degrees with respect to the first orientation;

a fourth PD pixel coupled to a fifth green color filter and the third microlens shared with the third PD pixel; and a second imaging pixel coupled to a sixth green color filter of the QCFA; and a processor implemented in circuitry and coupled to the camera, wherein the processor is configured to:

control one or more first exposure settings of the first PD pixel; and control one or more second exposure settings of the first imaging pixel independent from the one or more first exposure settings.

2. The device of claim 1, wherein the processor is further configured to:

receive image data captured using the first PD pixel and a second PD pixel of the first sub-tile sharing the first microlens;

receive image data captured using the first imaging pixel;

detect one or more phases based on the captured image data from the first PD pixel and the second PD pixel; and generate an image based on the captured image data from the first imaging pixel.

3. The device of claim 2, wherein the processor is further configured to:

receive image data captured using the third PD pixel of the second sub-tile;

receive image data captured using a fourth PD pixel coupled to the third microlens shared with the third PD pixel;

receive image data captured using the second imaging pixel coupled to a sixth green color filter of the QCFA;

detect one or more phases based on the captured image data from the third PD pixel and the fourth PD pixel; and generate the image further based on the captured image data from the second imaging pixel.

4. A computer-implemented method, comprising:

controlling, by a processor, one or more first exposure settings of a first phase detection (PD) pixel of a camera sensor of a camera;

controlling, by the processor, one or more second exposure settings of a first imaging pixel of the camera sensor independently from controlling the one or more first exposure settings;

receiving, by the processor, captured image data from the camera coupled to the processor, wherein the camera includes:

the camera sensor including a plurality of tiles of four pixels by four pixels, wherein each tile includes a first sub-tile, a second sub-tile, a third sub-tile, and a fourth sub-tile of two pixels by two pixels; and a quad color filter array (QCFA) coupled to the camera sensor, the QCFA including a plurality of red color filters, a plurality of green color filters, and a plurality of blue color filters;

wherein a first sub-tile of a first tile includes:

the first PD pixel coupled to a first microlens shared with at least one other pixel of the first tile, wherein the first microlens includes a first orientation with respect to the camera sensor and is shared by the first PD pixel and a second PD pixel of the first sub-tile, and wherein the first PD pixel is coupled to a first green color filter and the second PD pixel is coupled to a second green color filter; and the first imaging pixel coupled to a second microlens different from the first microlens, wherein the first imaging pixel is coupled to a third green color filter of the QCFA;

wherein the second sub-tile includes:

a third PD pixel coupled to a fourth green color filter and a third microlens, wherein the third microlens includes a second orientation 90 degrees with respect to the first orientation;

a fourth PD pixel coupled to a fifth green color filter and the third microlens shared with the third PD pixel; and a second imaging pixel coupled to a sixth green color filter of the QCFA.

5. The method of claim 4, further comprising:

capturing image data by the first PD pixel and a second PD pixel of the first sub-tile sharing the first microlens;

capturing image data by the first imaging pixel;

detecting, by the processor, one or more phases based on the captured image data from the first PD pixel and the second PD pixel; and generating an image based on the captured image data from the first imaging pixel.

6. The method of claim 5, further comprising:

capturing image data by the third PD pixel of the second sub-tile;

capturing image data by a fourth PD pixel coupled to the third microlens shared with the third PD pixel;

capturing image data by the second imaging pixel coupled to a sixth green color filter of the QCFA; and detecting, by the processor, one or more phases based on the captured image data from the third PD pixel and the fourth PD pixel;

wherein generating the image is further based on the captured image data from the second imaging pixel.

7. A non-transitory computer-readable medium storing instructions that, when executed by a processor of a device, cause the device to:

control one or more first exposure settings of a first phase detection (PD) pixel of a camera sensor of a camera;

control one or more second exposure settings of a first imaging pixel of the camera sensor independently from controlling the one or more first exposure settings;

receive, by a processor of the device, captured image data from the camera coupled to the processor, wherein the camera includes:

the camera sensor including a plurality of tiles of four pixels by four pixels, wherein each tile includes a first sub-tile, a second sub-tile, a third sub-tile, and a fourth sub-tile of two pixels by two pixels; and a quad color filter array (QCFA) coupled to the camera sensor, the QCFA including a plurality of red color filters, a plurality of green color filters, and a plurality of blue color filters;

wherein a first sub-tile of a first tile includes:
the first PD pixel coupled to a first microlens shared with at least one other pixel of the first tile, wherein the first microlens includes a first orientation with respect to the camera sensor and is shared by the first PD pixel and a second PD pixel of the first sub-tile, and wherein the first PD pixel is coupled to a first green color filter and the second PD pixel is coupled to a second green color filter; and
the first imaging pixel coupled to a second microlens different from the first microlens, wherein the first imaging pixel is coupled to a third green color filter of the QCFA;
wherein the second sub-tile includes:
a third PD pixel coupled to a fourth green color filter and a third microlens, wherein the third microlens includes a second orientation 90 degrees with respect to the first orientation;
a fourth PD pixel coupled to a fifth green color filter and the third microlens shared with the third PD pixel; and
a second imaging pixel coupled to a sixth green color filter of the QCFA.

8. The computer-readable medium of claim 7, wherein execution of the instructions further causes the device to:
capture image data by the first PD pixel and a second PD pixel of the first sub-tile sharing the first microlens;
capture image data by the first imaging pixel;
detect one or more phases based on the captured image data from the first PD pixel and the second PD pixel; and
generate an image based on the captured image data from the first imaging pixel.

9. The computer-readable medium of claim 8, wherein execution of the instructions further causes the device to:
capture image data by a third PD pixel of the second sub tile;
capture image data by a fourth PD pixel coupled to the third microlens shared with the third PD pixel;
capture image data by the second imaging pixel coupled to a sixth green color filter of the QCFA; and
detect, by the processor, one or more phases based on the captured image data from the third PD pixel and the fourth PD pixel;
wherein generating the image is further based on the captured image data from the second imaging pixel.

10. A device, comprising:
means for controlling one or more first exposure settings of a first phase detection (PD) pixel of a camera sensor of a camera;
means for controlling one or more second exposure settings of a first imaging pixel of the camera sensor independently from controlling the one or more first exposure settings;
means for receiving captured image data from the camera, wherein the camera includes:
the camera sensor including a plurality of tiles of four pixels by four pixels, wherein each tile includes a first sub-tile, a second sub-tile, a third sub-tile, and a fourth sub-tile of two pixels by two pixels; and
a quad color filter array (QCFA) coupled to the camera sensor, the QCFA including a plurality of red color filters, a plurality of green color filters, and a plurality of blue color filters;
wherein a first sub-tile of a first tile includes:
the first PD pixel coupled to a first microlens shared with at least one other pixel of the first tile, wherein the first microlens includes a first orientation with respect to the camera sensor and is shared by the first PD pixel and a second PD pixel of the first sub-tile, and wherein the first PD pixel is coupled to a first green color filter and the second PD pixel is coupled to a second green color filter; and
the first imaging pixel coupled to a second microlens different from the first microlens, wherein the first imaging pixel is coupled to a third green color filter of the QCFA;
wherein the second sub-tile includes:
a third PD pixel coupled to a fourth green color filter and a third microlens, wherein the third microlens includes a second orientation 90 degrees with respect to the first orientation;
a fourth PD pixel coupled to a fifth green color filter and the third microlens shared with the third PD pixel; and
a second imaging pixel coupled to a sixth green color filter of the QCFA.

11. The device of claim 10, further comprising:
means for receiving image data captured using the first PD pixel and a second PD pixel of the first sub-tile sharing the first microlens;
means for receiving image data captured using the first imaging pixel;
means for detecting one or more phases based on the captured image data from the first PD pixel and the second PD pixel; and
means for generating an image based on the captured image data from the first imaging pixel.

12. The device of claim 11, further comprising:
means for receiving image data captured using the third PD pixel of the second sub-tile;
means for receiving image data captured using a fourth PD pixel coupled to the third microlens shared with the third PD pixel;
means for receiving image data captured using the second imaging pixel coupled to a sixth green color filter of the QCFA; and
means for detecting one or more phases based on the captured image data from the third PD pixel and the fourth PD pixel;
wherein the means for generating is configured to generate the image further based on the captured image data from the second imaging pixel.

* * * * *